US010470343B2

(12) United States Patent
Shibata et al.

(10) Patent No.: US 10,470,343 B2
(45) Date of Patent: Nov. 5, 2019

(54) POWER CONVERSION DEVICE FOR RAILWAY VEHICLE

(71) Applicant: FUJI ELECTRIC CO., LTD., Kawasaki-shi, Kanagawa (JP)

(72) Inventors: Misato Shibata, Hino (JP); Kimihisa Kaneko, Yokohama (JP); Yoshihisa Uehara, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 113 days.

(21) Appl. No.: 15/468,220

(22) Filed: Mar. 24, 2017

(65) Prior Publication Data

US 2017/0318709 A1    Nov. 2, 2017

(30) Foreign Application Priority Data

Apr. 28, 2016  (JP) ................. 2016-090266
Dec. 16, 2016  (JP) ................. 2016-244911

(51) Int. Cl.
*H05K 7/20* (2006.01)
*B61C 17/00* (2006.01)
*B61F 1/00* (2006.01)

(52) U.S. Cl.
CPC ......... *H05K 7/20854* (2013.01); *B61C 17/00* (2013.01); *B61F 1/00* (2013.01); *H05K 7/209* (2013.01); *H05K 7/20863* (2013.01); *H05K 7/20909* (2013.01)

(58) Field of Classification Search
CPC .......... H05K 7/20909; H05K 7/20918; H05K 7/20145

USPC .................................. 165/44, 80.3, 185
See application file for complete search history.

(56) References Cited

U.S. PATENT DOCUMENTS

| 4,765,397 A * | 8/1988 | Chrysler ............ H01L 23/473 165/104.33 |
| 6,648,062 B2 * | 11/2003 | Fukazu ................ F28F 3/04 165/185 |
| 6,668,915 B1 * | 12/2003 | Materna ................ F28F 1/10 165/146 |
| 7,367,385 B1 * | 5/2008 | Materna ................ F28F 1/025 165/146 |
| 8,813,832 B2 * | 8/2014 | Miki .................. B61C 17/00 165/182 |
| 8,854,807 B2 * | 10/2014 | Hoffmann ......... H05K 7/20909 165/80.3 |
| 2010/0277871 A1 * | 11/2010 | Kitanaka ............. B60L 9/16 361/710 |

(Continued)

FOREIGN PATENT DOCUMENTS

JP  2007-013223 A  1/2007
JP  2014-117011 A  6/2014

(Continued)

*Primary Examiner* — Allen J Flanigan
(74) *Attorney, Agent, or Firm* — Manabu Kanesaka

(57) ABSTRACT

This power conversion device for a railway vehicle includes a first radiation fin radiating heat from a semiconductor device and a second radiation fin arranged at a prescribed interval from the first radiation fin in a traveling direction for radiating heat from the semiconductor device. At least either one of the first and second radiation fins includes an air duct formed by partially not providing a plurality of fin portions.

20 Claims, 8 Drawing Sheets

(56) References Cited

U.S. PATENT DOCUMENTS

2015/0371920 A1\* 12/2015 Kawaguchi ........ H05K 7/20918
361/704

FOREIGN PATENT DOCUMENTS

| JP | 2014-234092 A | 12/2014 | | |
|---|---|---|---|---|
| WO | WO-2014203374 A1 \* | 12/2014 | ........... | H01L 23/467 |

\* cited by examiner

[FIRST EMBODIMENT]

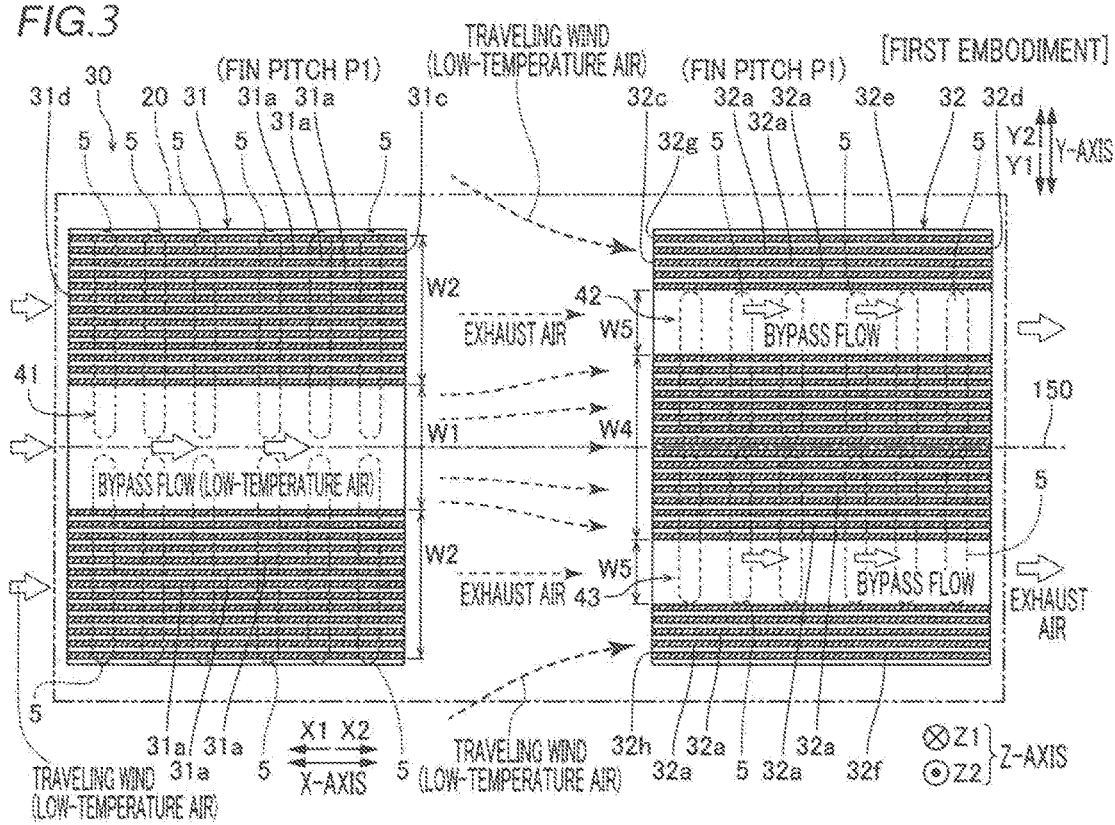
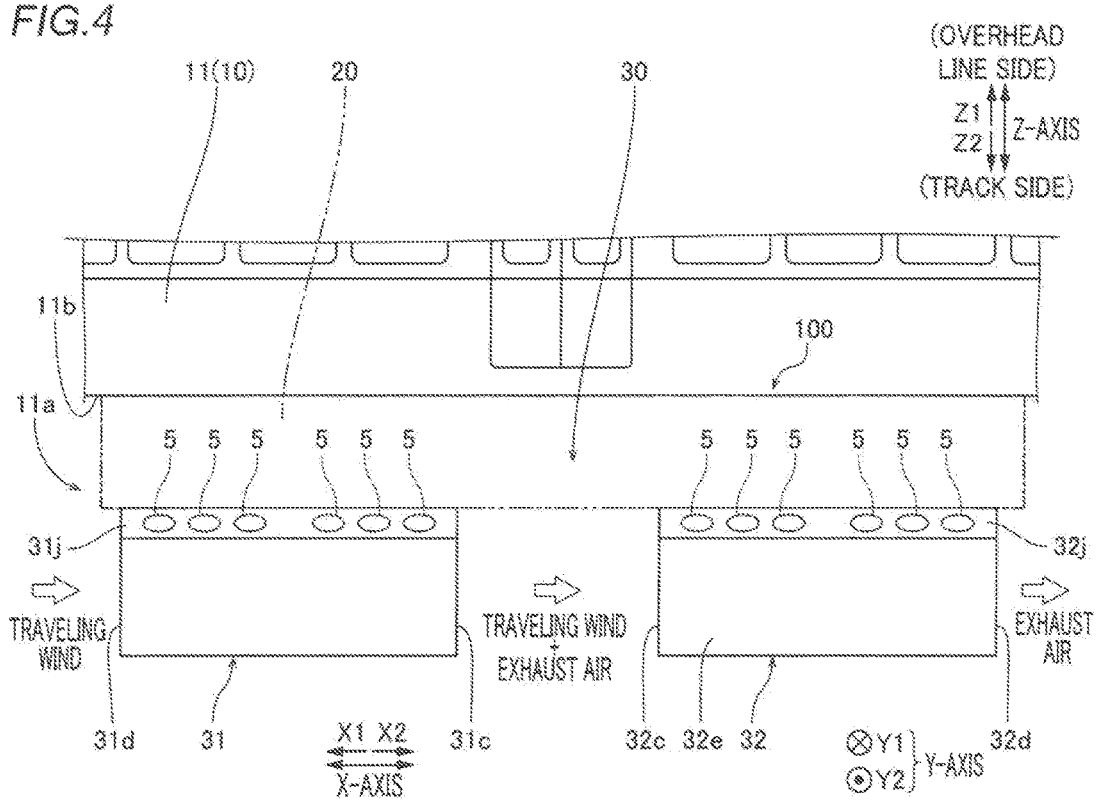

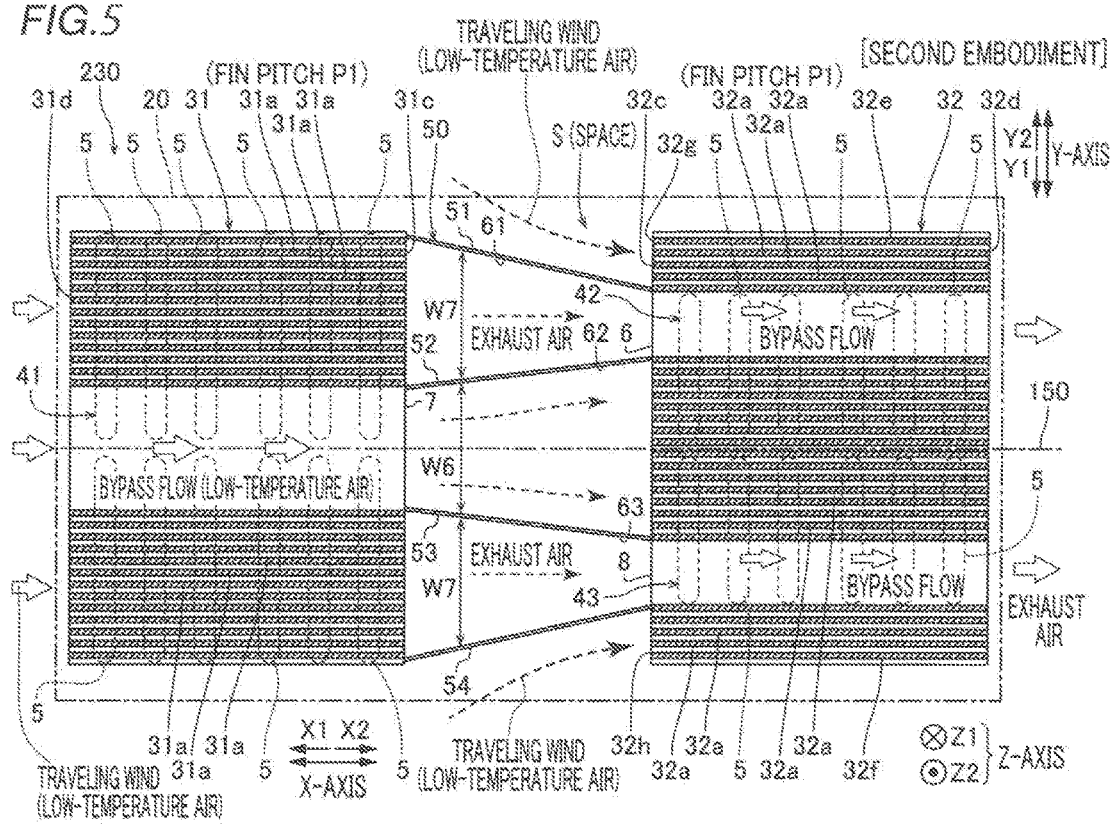
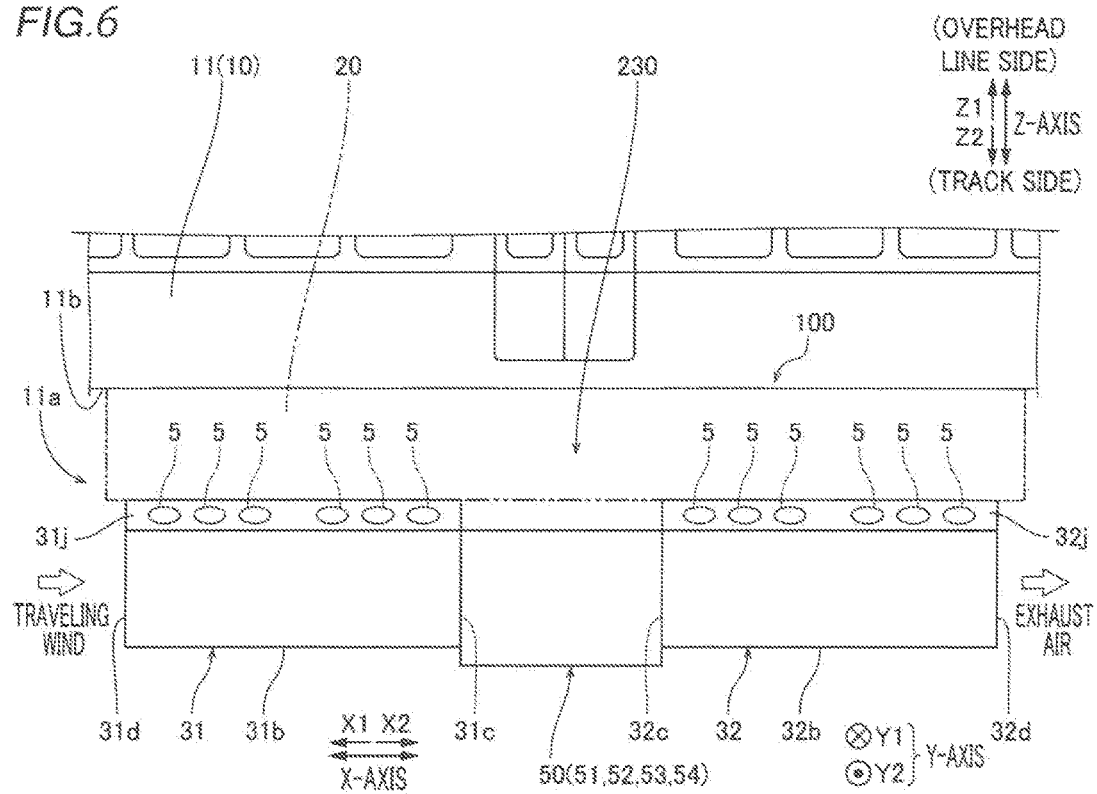

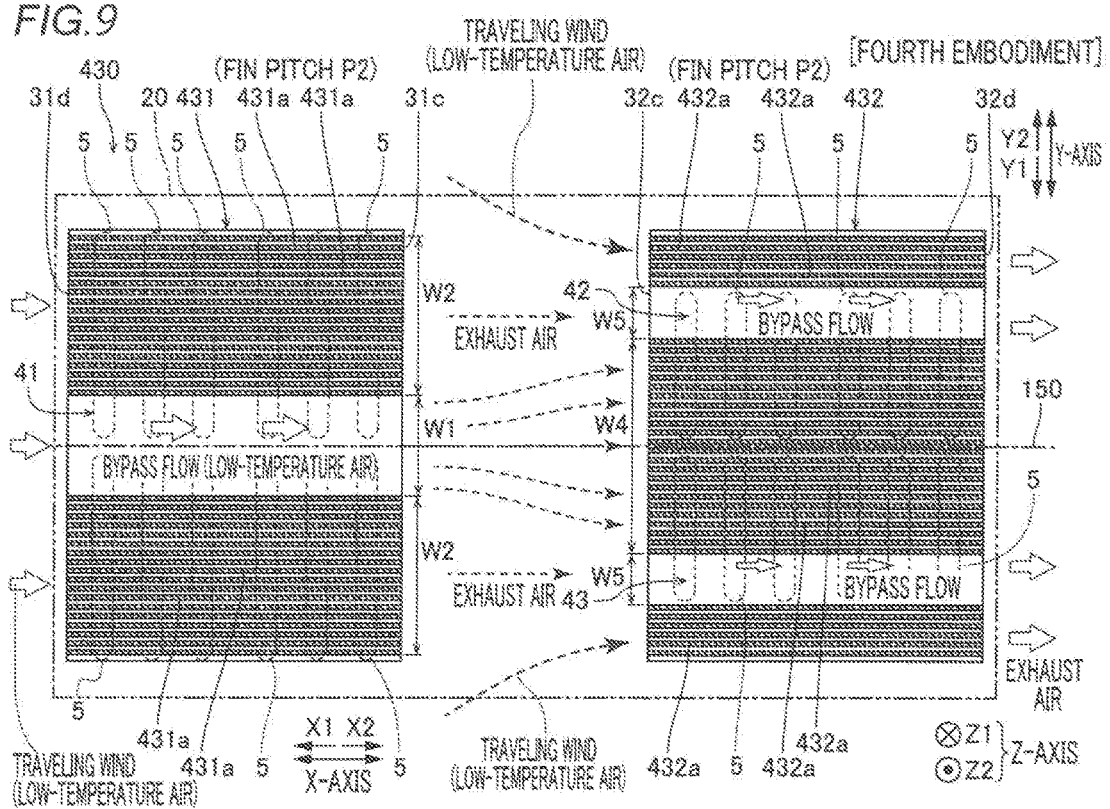
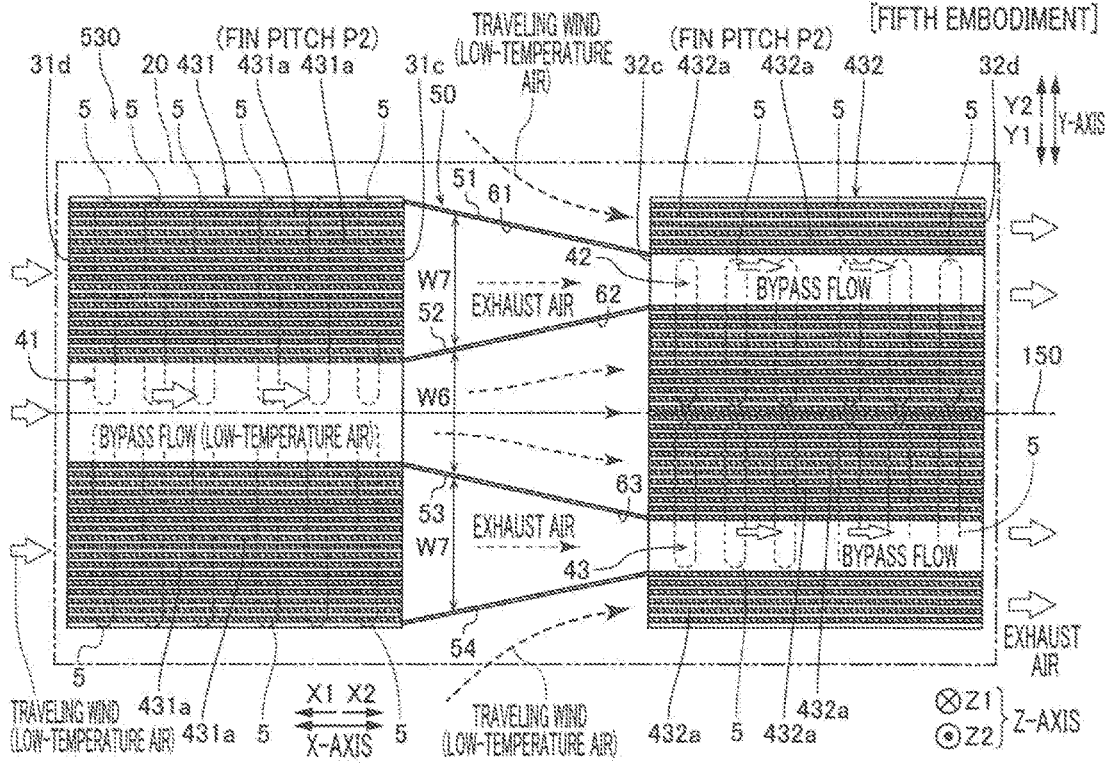

POWER CONVERSION DEVICE FOR RAILWAY VEHICLE

CROSS-REFERENCE TO RELATED APPLICATIONS

The priority application numbers JP2016-090266, Power Conversion Device for Railway Vehicle, Apr. 28, 2016, Misato Shibata and Yoshihisa Uehara, and JP2016-244911, Power Conversion Device for Railway Vehicle, Dec. 16, 2016, Misato Shibata, Kimihisa Kaneko and Yoshihisa Uehara, upon which this patent application is based, are hereby incorporated by reference.

BACKGROUND OF THE INVENTION

Field of the Invention

The present invention relates to a power conversion device for a railway vehicle, and more particularly, it relates to a power conversion device for a railway vehicle including a plurality of radiation fins radiating heat from an apparatus loaded on a railway vehicle at the time of traveling.

Description of the Background Art

A power conversion device for a railway vehicle including a plurality of radiation fins radiating heat from an apparatus loaded on a railway vehicle at the time of traveling is known in general, as disclosed in Japanese Patent Laying-Open No. 2007-13223, for example.

Japanese Patent Laying-Open No. 2007-13223 discloses a power conversion device for a railway vehicle including a plurality of coolers (radiation fins) used for a power conversion device for driving a vehicle set in an underfloor space of a railway vehicle. In the power conversion device for a railway vehicle disclosed in Japanese Patent Laying-Open No. 2007-13223, coolers (radiation fins) are arranged on the lower surface of the body of a box-shaped power conversion device in a state divided into three along the traveling direction of the vehicle. Traveling wind resulting from traveling of the railway vehicle is supplied to the cooler positioned on the most windward side and successively supplied to the coolers provided at the rear stage (on the downstream side), thereby radiating (discharging) heat from the coolers to the open air (atmospheric air).

In the power conversion device for a railway vehicle described in Japanese Patent Laying-Open No. 2007-13223, however, air warmed by drawing heat from the cooler (radiation fin) provided on the upstream side in the traveling direction of the vehicle (on the windward side in the traveling wind) is conceivably successively supplied to the adjacent coolers provided on the downstream side (at the rear stage). In this case, the cooler positioned on the most windward side exhibits an excellent cooling performance through heat exchange with fresh air having a relatively low temperature, while the cooling performances (radiation performances) of the remaining two coolers provided on the downstream side are lowered as compared with that of the cooler provided on the upstream side due to successive heat exchange with the air (having a higher temperature higher than the fresh air) warmed by drawing heat from the cooler provided on the upstream side. Therefore, the cooling performances (radiation performances) of the individual coolers (radiation fins) are disadvantageously dispersed.

SUMMARY OF THE INVENTION

The present invention has been proposed in order to solve the aforementioned problem, and an object of the present invention is to provide a power conversion device for a railway vehicle capable of leveling cooling performances (radiation performances) of the respective ones of a plurality of heat radiation fins.

In order to attain the aforementioned object, a power conversion device for a railway vehicle according to an aspect of the present invention includes a first radiation fin having a plurality of fin portions provided to extend along a traveling direction of the railway vehicle for radiating heat from the body of the power conversion device loaded on the railway vehicle and a second radiation fin, arranged at a prescribed interval from the first radiation fin in the traveling direction, having a plurality of fin portions provided to extend along the traveling direction for radiating heat from the body of the power conversion device, while at least either one of the first radiation fin and the second radiation fin includes an air duct, extending along the traveling direction, formed by partially not providing the plurality of fin portions, for supplying part of air taken from an end portion of either the first radiation fin or the second radiation fin in the traveling direction and circulated through the air duct to be discharged to an end portion of either the second radiation fin or the first radiation fin in the traveling direction at the time of traveling of the railway vehicle.

In the power conversion device for a railway vehicle according to the aforementioned aspect, as hereinabove described, at least either one of the first radiation fin and the second radiation fin includes the air duct, extending along the traveling direction, formed by partially not providing the plurality of fin portions, for supplying part of the air taken from the end portion of either the first radiation fin or the second radiation fin in the traveling direction and circulated through the air duct to be discharged to the end portion of either the second radiation fin or the first radiation fin in the traveling direction at the time of traveling of the railway vehicle. Thus, when the railway vehicle travels with the first radiation fin at the forefront (on the windward side), for example, the first radiation fin exhibits an excellent cooling performance through heat exchange with fresh air (traveling wind) having a relatively low temperature, while the fresh air circulated (bypassed) through the air duct can be supplied to the second radiation fin at the rear stage (on the downstream side). In other words, the fresh air (low-temperature air) is so supplied to the second radiation fin that the cooling performance (radiation performance) thereof can be maintained at a level equivalent to that of the first radiation fin provided on the upstream side, dissimilarly to a case where air (high-temperature air) warmed in the first radiation fin is supplied to the second radiation fin at the rear stage (on the downstream side). Consequently, the cooling performances (radiation performances) of the respective ones of the first and second radiation fins can be leveled.

In the power conversion device for a railway vehicle according to the aforementioned aspect, the air duct preferably includes a first air duct provided on the first radiation fin and a second air duct provided on a position of the second radiation fin different from the first air duct in a direction orthogonal to the traveling direction, the second radiation fin is preferably provided with the plurality of fin portions on a position opposed to the first air duct in the traveling direction, and the first radiation fin is preferably provided with the plurality of fin portions on a position opposed to the second air duct in the traveling direction. According to this structure, fresh air circulated (bypassed) through the first air duct can be reliably supplied to the plurality of fin portions (heat-exchange regions) of the second radiation fin at the rear stage (on the downstream side) when the railway vehicle travels with the first radiation fin at the forefront (on the windward side). When the railway vehicle travels with the second radiation fin at the forefront (on the windward side), on the other hand, fresh air circulated (bypassed) through the second air duct can be reliably supplied to the plurality of fin portions (heat-exchange regions) of the first radiation fin at the rear stage (on the downstream side). Therefore, the cooling performances (radiation performances) of the respective ones of the first and second radiation fins can be both leveled regardless of the traveling direction (running direction) of the railway vehicle.

In the aforementioned structure having the air duct including the first air duct and the second air duct, the first air duct is preferably provided on a central region of the first radiation fin in the direction orthogonal to the traveling direction, and air circulated through the first air duct to be discharged is preferably supplied to end portions of the plurality of fin portions provided on a position corresponding to a central region of the second radiation fin in the direction orthogonal to the traveling direction, while air circulated through the plurality of fin portions other than the first air duct to be discharged is preferably circulated through the second air duct of the second radiation fin and discharged when the railway vehicle travels with the first radiation fin at the forefront in the traveling direction. According to this structure, fresh air circulated through the first air duct provided on the central region of the first radiation fin in the direction orthogonal to the traveling direction can be reliably supplied to the plurality of fin portions provided on the position corresponding to the central region of the second radiation fin in the direction orthogonal to the traveling direction when the railway vehicle travels with the first radiation fin at the forefront. Further, warm air heat-exchanged through the plurality of fin portions in the first radiation fin can be easily circulated through the second air duct provided on the second radiation fin and discharged toward the downstream side of the second radiation fin. Also when the railway vehicle travels with the second radiation fin at the forefront, effects similar to the above can be attained, with the exception that the direction of the traveling wind is reversed.

In the aforementioned structure having the air duct including the first air duct and the second air duct, the range of formation of the plurality of fin portions of the second radiation fin provided on the position opposed to the first air duct in the direction orthogonal to the traveling direction is preferably broader than the width of the first air duct in the direction orthogonal to the traveling direction, and the range of formation of the plurality of fin portions of the first radiation fin provided on the position opposed to the second air duct in the direction orthogonal to the traveling direction is preferably broader than the width of the first air duct in the direction orthogonal to the traveling direction. According to this structure, fresh air (traveling wind) circulated through the first air duct (or the second air duct) to be diffused and discharged toward the downstream side can be effectively supplied to the plurality of fin portions of the second radiation fin (or the first radiation fin) having the width (range of formation) broader than the first air duct (or the second air duct) regardless of the traveling direction of the railway vehicle. Therefore, heat exchange with the fresh air can be reliably performed also in the second radiation fin (or the first radiation fin) on the downstream side.

In the aforementioned structure having the air duct including the first air duct and the second air duct, the width of the first air duct along the direction orthogonal to the traveling direction is preferably smaller than the range of formation of the plurality of fin portions other than the first air duct in the first radiation fin. According to this structure, a sufficient range of formation can be ensured for the plurality of fin portions (heat-exchange regions) other than the first air duct also when the first radiation fin is provided with the first air duct having no fin portions, whereby fresh air (traveling wind) can be supplied to the plurality of fin portions of the second radiation fin through the first air duct without remarkably lowering the cooling performance (radiation performance) of the first radiation fin.

In the aforementioned structure having the air duct including the first air duct and the second air duct, the second air duct is preferably provided on the side of an end portion of the second radiation fin in the direction orthogonal to the traveling direction. According to this structure, the plurality of fin portions (heat-exchange regions) for receiving the fresh air (traveling wind) supplied from the first air duct can be easily provided on the central region of the second radiation fin in the direction orthogonal to the traveling direction.

In this case, the second air duct is preferably provided on a region close to both end portions of the second radiation fin in the direction orthogonal to the traveling direction. According to this structure, a pair of second air ducts provided on the region close to both end portions of the second radiation fin in the direction orthogonal to the traveling direction can hold the plurality of fin portions (heat-exchange regions) provided on the position corresponding to the central region of the second radiation fin in the direction orthogonal to the traveling direction from both sides, whereby heat exchange with the fresh air supplied from the first air duct can be reliably performed in the plurality of fin portions (heat-exchange regions) of the second radiation fin.

In the aforementioned structure having the second air duct provided on the side of the end portions of the second radiation fin in the direction orthogonal to the traveling direction, air taken from a side end portion of the second radiation fin in the traveling direction is preferably supplied to the plurality of fin portions provided on an end region in the direction orthogonal to the traveling direction beyond the second air duct when the railway vehicle travels with the first radiation fin at the forefront in the traveling direction. According to this structure, not only the fresh air (traveling wind) supplied through the first air duct but also air (fresh air) taken from the side end portion of the second radiation fin in the traveling direction can be supplied to the plurality of fin portions (additional heat-exchange regions) provided outside the second air duct (on the end region in the direction orthogonal to the traveling direction) for heat exchange. Consequently, the cooling performance (radiation performance) of the second radiation fin can be maintained at a high level.

The power conversion device for a railway vehicle according to the aforementioned aspect preferably further includes a heat pipe provided within a connection region of at least either one of the first radiation fin and the second radiation fin, including the air duct, with the body of the power conversion device to extend in the direction orthogonal to the traveling direction over the region of formation of the plurality of fin portions and the region of formation of the air duct. According to this structure, heat (exhaust heat) transmitted from the body of the power conversion device to the first or second radiation fin is not filled in a connection region between a rear-side portion of the air duct and the body of the power conversion device but can be transported to connection regions between the plurality of fin portions other than the air duct and the body of the power conversion device through the heat pipe. Therefore, the bottom surface of the air duct can be effectively prevented from abnormal heat generation. Further, heat can be efficiently radiated from the body of the power conversion device through the plurality of fin portions (heat-exchange regions) other than the air duct.

The power conversion device for a railway vehicle according to the aforementioned aspect preferably further includes a wind guide member provided on a region between the first radiation fin and the second radiation fin for guiding part of air taken from an end portion of either the first radiation fin or the second radiation fin in the traveling direction and circulated through the air duct to be discharged to the fin portions on an end portion of either the second radiation fin or the first radiation fin in the traveling direction. According to this structure, fresh air circulated (bypassed) through the air duct can be reliably supplied to the plurality of fin portions of the second radiation fin at the rear stage (on the downstream side) when the railway vehicle travels with the first radiation fin at the forefront (on the windward side). Also when the railway vehicle travels with the second radiation fin at the forefront (on the windward side), fresh air circulated (bypassed) through the air duct can be reliably supplied to the plurality of fin portions of the first radiation fin at the rear stage (on the downstream side). Further, the wind guide member can separate the flow of fresh air (low-temperature air) circulated through the air duct and supplied to the second radiation fin (or the first radiation fin) and the flow of air (high-temperature air) heat-exchanged and warmed in the first radiation fin (or the second radiation fin) from each other. Thus, the roles of the air duct and the fin portions (heat-exchange regions) can be clearly distinguished from each other to effectively function respectively in the second radiation fin (or the first radiation fin) at the rear stage (on the downstream side).

In the aforementioned structure further including the wind guide member, the wind guide member preferably connects an outlet of the air duct with end portions of the plurality of fin portions provided on a position opposed to the air duct in the traveling direction on the region. According to this structure, fresh air (low-temperature air) circulated through the air duct and supplied to the second radiation fin (or the first radiation fin) can be supplied to the end portions of the plurality of fin portions of the second radiation fin (or the first radiation fin) without leaking outward from the end portions of the first radiation fin (or the second radiation fin) provided on the downstream side. Further, the flow of fresh air (low-temperature air) circulated through the air duct and supplied to the second radiation fin (or the first radiation fin) and the flow of air (high-temperature air) heat-exchanged and warmed in the first radiation fin (or the second radiation fin) can be more reliably separated from each other.

In the aforementioned structure further including the wind guide member, the wind guide member preferably includes a wind guide wall extending outward beyond forward end portions of the plurality of fin portions of each of the first radiation fin and the second radiation fin in the direction orthogonal to the traveling direction. According to this structure, the flow of fresh air (low-temperature air) circulated through the air duct and supplied to the second radiation fin (or the first radiation fin) and the flow of air (high-temperature air) heat-exchanged and warmed in the first radiation fin (or the second radiation fin) can be more reliably inhibited from leaking to regions other than that between the first and second radiation fins and mixing with each other.

In this case, the wind guide member preferably further includes a bottom surface connecting outer end portions of a pair of the wind guide walls, and the bottom surface is preferably inclined to approach toward a position corresponding to end portions of the plurality of fin portions provided on the position opposed to the air duct in the traveling direction from a position outward beyond an outlet of the air duct in the direction orthogonal to the traveling direction on the region. According to this structure, not only fresh air circulated through the air duct but also traveling wind flowing outside the first radiation fin can be collected through the duct-shaped wind guide member and supplied to the second radiation fin at the rear stage (on the downstream side) when the railway vehicle travels with the first radiation fin at the forefront (on the windward side). Thus, a larger quantity of fresh air can be supplied to the end portions of the plurality of fin portions (heat-exchange regions) of the second radiation fin at the rear stage. Also when the railway vehicle travels with the second radiation fin at the forefront, effects similar to the above can be attained, with the exception that the direction of the traveling wind is reversed.

In the aforementioned structure in which the range of formation of the plurality of fin portions of the second radiation fin in the direction orthogonal to the traveling direction is broader than the width of the first air duct in the direction orthogonal to the traveling direction, the power conversion device for a railway vehicle preferably further includes a wind guide member provided on a region between the first radiation fin and the second radiation fin for guiding part of air taken from an end portion of either the first radiation fin or the second radiation fin in the traveling direction and circulated through the air duct to be discharged to the fin portions on an end portion of either the second radiation fin or the first radiation fin in the traveling direction, and the width of the wind guide member in the direction orthogonal to the traveling direction is preferably gradually increased from an outlet of the air duct toward end portions of the plurality of fin portions. According to this structure, fresh air circulated through the air duct can be uniformly supplied over the whole region (heat-exchange region) of the range of formation of the plurality of fin portions of the second radiation fin when the railway vehicle travels with the first radiation fin at the forefront (on the windward side), whereby the cooling performance (radiation performance) of the second radiation fin can be maintained at a high level. Also when the railway vehicle travels with the second radiation fin at the forefront, effects similar to the above can be attained, with the exception that the direction of the traveling wind is reversed.

In the power conversion device for a railway vehicle according to the aforementioned aspect, the arrangement structure of the plurality of fin portions and the air duct in the first radiation fin and the arrangement structure of the plurality of fin portions and the air duct in the second radiation fin preferably have shapes symmetrical with respect to a centerline along the traveling direction in the direction orthogonal to the traveling direction. According to this structure, heat radiation characteristics of the first and second radiation fins along the direction orthogonal to the traveling direction can be rendered symmetrical with respect to the centerline along the traveling direction. When observing the first and second radiation fins as a single cooler, therefore, the cooler can be prevented from local deviation of heat radiation characteristics. Consequently, the overall cooling performance (radiation performance) of the cooler provided in the railway vehicle can be maintained at a constant level without being remarkably influenced by traveling conditions of the railway vehicle and the strength of the traveling wind.

In the aforementioned structure having the air duct including the first air duct and the second air duct, the second air duct is preferably provided on a position of the second radiation fin different from the first air duct in a crosstie direction orthogonal to the traveling direction. According to this structure, the cooling performances (radiation performances) of the respective ones of the first and second radiation fins can be both leveled regardless of the traveling direction (running direction) of the railway vehicle when the plurality of fin portions provided on each of the first and second radiation fins extend toward the vertical direction of the railway vehicle.

In this case, the first radiation fin and the second radiation fin are preferably set in an underfloor space of the railway vehicle, while the plurality of fin portions provided on each of the first radiation fin and the second radiation fin preferably extend toward a lower portion of the railway vehicle. According to this structure, the first and second radiation fins, whose cooling performances (radiation performances) for cooling the body of the power conversion device can be effectively leveled, can be easily set when a sufficient space for setting the first and second radiation fins is present under the body of the power conversion device in the railway vehicle having the underfloor space for setting the power conversion device for a railway vehicle (the body of the power conversion device).

In the aforementioned structure having the air duct including the first air duct and the second air duct, the second air duct is preferably provided on a position of the second radiation fin different from the first air duct in a vertical direction of the railway vehicle orthogonal to the traveling direction. According to this structure, the cooling performances (radiation performances) of the respective ones of the first and second radiation fins can be both leveled regardless of the traveling direction (running direction) of the railway vehicle when the plurality of fin portions provided on each of the first and second radiation fins extend toward a side portion of the railway vehicle.

In this case, the first radiation fin and the second radiation fin are preferably set in an underfloor space of the railway vehicle, while the plurality of fin portions provided on each of the first radiation fin and the second radiation fin extend toward a side portion of the railway vehicle. According to this structure, the first and second radiation fins, whose cooling performances (radiation performances) for cooling the body of the power conversion device can be effectively leveled, can be easily set when a sufficient space for setting the first and second radiation fins is present on a side portion of the body of the power conversion device in the railway vehicle having the power conversion device for a railway vehicle (the body of the power conversion device) set in the underfloor space. Further, the first and second radiation fins are so provided on the side portion of the body of the power conversion device that the same are exposed on the side portion of the railway vehicle at the time of traveling of the railway vehicle. Thus, relatively unturbulent traveling wind can be taken as compared with a case of taking fresh air from under the railway vehicle mounted with other devices or the like, whereby fresh air from the side portion of the railway vehicle can be easily taken through the first and second radiation fins. Consequently, the cooling performance (radiation performance) of the cooling portion can be further improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a bottom plan view showing a cooling structure of a power conversion device according to the first embodiment of the present invention;

FIG. 4 is a side elevational view showing the cooling structure of the power conversion device according to the first embodiment of the present invention;

FIG. 5 is a bottom plan view showing a cooling structure of a power conversion device according to a second embodiment of the present invention;

FIG. 6 is a side elevational view showing the cooling structure of the power conversion device according to the second embodiment of the present invention;

FIG. 9 is a bottom plan view showing a cooling structure of a power conversion device according to a fourth embodiment of the present invention;

FIG. 10 is a bottom plan view showing a cooling structure of a power conversion device according to a fifth embodiment of the present invention;

DESCRIPTION OF THE PREFERRED EMBODIMENTS

Embodiments of the present invention are now described with reference to the drawings.

[First Embodiment]

First, the structure of a power conversion device 100 for a railway vehicle 10 defining a travel axis which includes travel directions opposed to each other, according to a first embodiment of the present invention is described with reference to FIGS. 1 to 4. The power conversion device 100 is an example of the "power conversion device for a railway vehicle" in the scope of claims for patent. The following description is made on the assumption that X-, Y- and Z-axis directions correspond to a traveling direction of the railway vehicle 10 (a direction along the travel axis), a crosstie direction orthogonal to the X-axis direction on a track 1 and a vertical direction orthogonal to both of the X- and Y-axis directions respectively.

Figure 1:
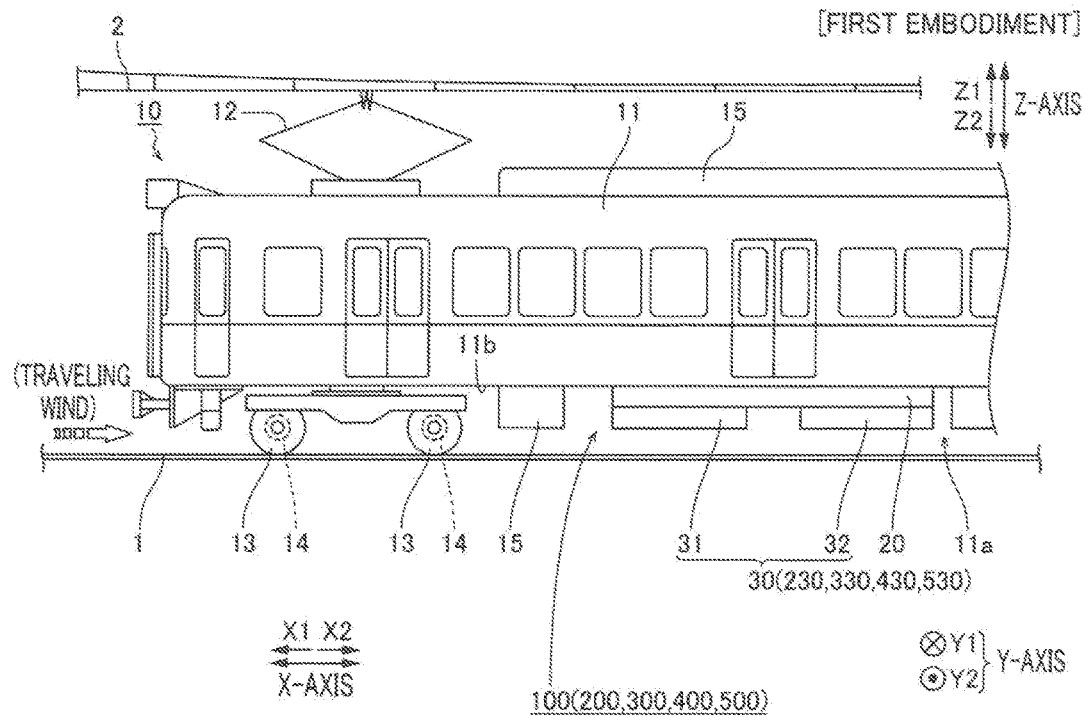
FIG. 1 is a side elevational view showing a railway vehicle according to a first embodiment of the present invention.
Figure 2:
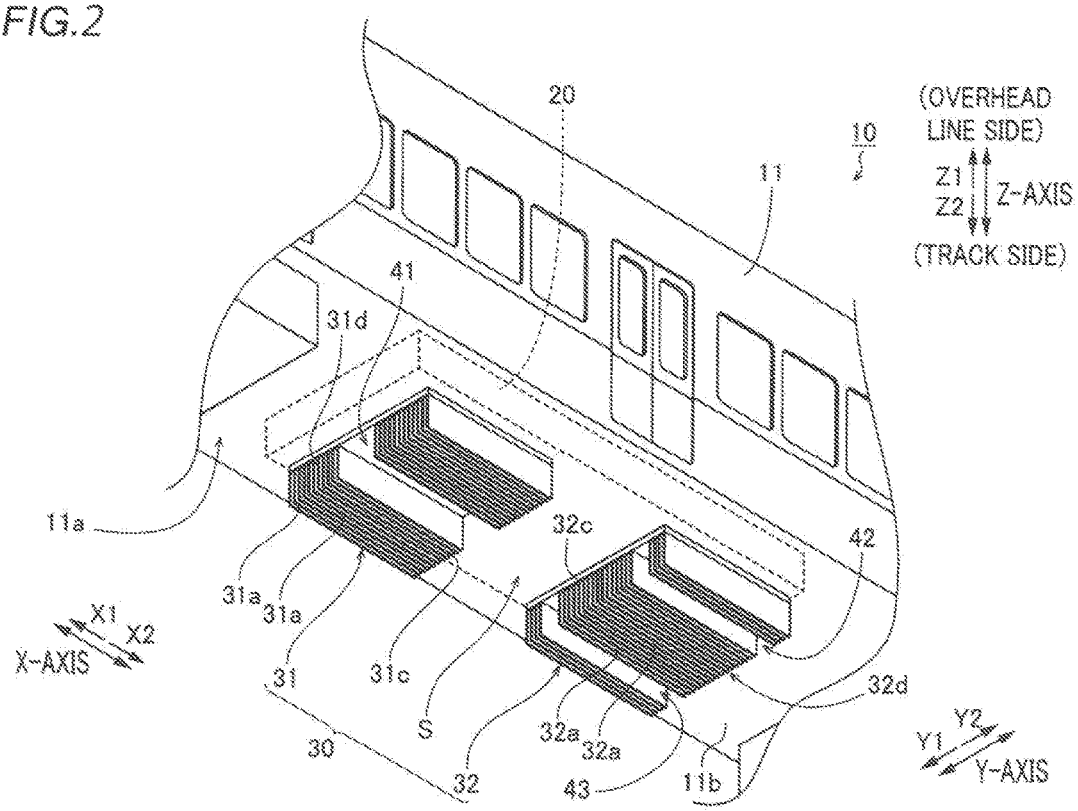
FIG. 2 is a perspective view of the railway vehicle according to the first embodiment of the present invention as viewed obliquely from below.

The power conversion device 100 according to the first embodiment of the present invention is set in an underfloor space 11a of a body 11 of the railway vehicle 10, as shown in FIGS. 1 and 2. A rough structure of the railway vehicle 10 is now briefly described. As shown in FIG. 1, the railway vehicle 10 includes the body 11, a pantograph 12 receiving (collecting) power supplied to an overhead line 2, induction motors 14 (shown by broken lines) rotating driving wheels 13 through the power received from the overhead line 2 and a plurality of other apparatuses 15 such as an air conditioner, a control apparatus and the like. The power conversion device 100 converts the power received from the overhead line 2 through switching of a semiconductor element (not shown) at the time of traveling of the railway vehicle 10 for controlling rotation of the induction motors 14.

(Structure of Power Conversion Device)

The power conversion device 100 includes a semiconductor device 20 performing power conversion and a cooling portion 30 for radiating heat generated from the semiconductor element provided in the semiconductor device 20 toward the open air. As shown in FIG. 2, the power conversion device 100 is suspended from and fixed to a lower surface 11b of the body 11 in the underfloor space 11a of the body 11. The semiconductor device 20 is arranged on the side (along arrow Z1) of the lower surface 11b, while the cooling portion 30 is arranged on the side (along arrow Z2) of the track 1. The cooling portion 30 includes a radiation fin 31 (along arrow X1) and another radiation fin 32 (along arrow X2) arranged at a prescribed interval along the X-axis direction corresponding to the extensional direction of the body 11. The radiation fins 31 and 32 include a plurality of fin portions 31a and a plurality of fin portions 32a extending vertically downward (toward the track 1) from the lower surface (along arrow Z2) of the semiconductor device 20 in the form of thin plates along the X-axis direction respectively. The semiconductor device 20 is an example of the "body of the power conversion device" in the scope of claims for patent. The radiation fins 31 and 32 are examples of the "first radiation fin" and the "second radiation fin" in the scope of claims for patent respectively.

When the railway vehicle 10 travels along arrow X1 as shown in FIG. 1 (a first travel direction), air around the track 1 is relatively carried along arrow X2 and blown toward the cooling portion 30 provided in the underfloor space 11a. In this case, traveling wind is circulated along arrow X2 through a clearance between the radiation fin 31 (the plurality of fin portions 31a) and the radiation fin 32 (the plurality of fin portions 32a) (see FIG. 2) extending in the X-axis direction. Thus, heat is discharged from the cooling portion 30 to the atmospheric air. In the following description, it is assumed that the railway vehicle 10 travels along arrow X1 while the radiation fin 31 is arranged on the windward side (along arrow X1) in the traveling direction (running direction) and the radiation fin 32 is arranged on the leeward side (along arrow X2) serving as the rear stage.

According to the first embodiment, the radiation fin 31 includes an air duct 41 formed by partially not providing the plurality of fin portions 31a, as shown in FIGS. 2 and 3. The air duct 41 extends along the X-axis direction. The radiation fin 23 includes air ducts 42 and 43 formed by partially not providing the plurality of fin portions 32a. The air ducts 42 and 43 extend along the X-axis direction.

(Detailed Structure of Radiation Fin)

In the radiation fin 31, the plurality of fin portions 31a are provided on regions along arrows Y1 and Y2 with respect to the air duct 41 extending in the X-axis direction with a width W1 in the Y-axis direction (crosstie direction) about a centerline 150, as shown in FIG. 3. FIG. 3 shows the individual fin portions 31a in the form of thin plates in a hatched manner, in order to facilitate easy understanding of the state of arrangement of the plurality of fin portions 31a. While 36 fin portions 31a in total are present if no air duct 41 is provided, 10 fin portions 31a are originally removed due to the provision of the air duct 41. Therefore, 13 fin portions 31a are provided on each of the regions along arrows Y1 and Y2. The 13 fin portions 31a in the form of thin plates are adjacently arranged at a fin pitch P1. The air duct 41 is an example of the "first air duct" in the scope of claims for patent.

In the radiation fin 32, the air ducts 42 and 43 are provided along arrows Y1 and Y2 with respect to the plurality of fin portions 32a extending in the X-axis direction with a width W4 in the Y-axis direction about the centerline 150. While 36 fin portions 32a in total are present if no air ducts 42 and 43 are provided, five fin portions 32a and five fin portions 32a are originally removed due to the provision of the air ducts 42 and 43. Therefore, five fin portions 32a and five fin portions 32a are provided on regions of the air ducts 42 and 43 along arrows Y1 and Y2 respectively. Further, 16 fin portions 32a in total are provided on a region (central region of the radiation fin 32) held between the air ducts 42 and 43. FIG. 3 shows the individual fin portions 32a in the form of thin plates in a hatched manner, in order to facilitate easy understanding of the state of arrangement of the plurality of fin portions 32a. The fin portions 32a in the form of thin plates are arranged at the same fin pitch P1 as those of the radiation fin 31. The air ducts 42 and 43 are examples of the "second air duct" in the scope of claims for patent.

With reference to the radiation fin 31 provided along arrow X1, 16 fin portions 32a are provided on a position opposed to the air duct 41 in the traveling direction (X-axis direction) in the radiation fin 32 provided along arrow X2. With reference to the radiation fin 32 provided along arrow X2, on the other hand, 13 fin portions 31a and 13 fin portions 31a are provided on positions opposed to the air ducts 42 and 43 in the X-axis direction respectively in the radiation fin 31 provided along arrow X1. In other words, the arrangement structure of the air duct 41 and the fin portions 31a provided on both sides thereof in the radiation fin 31 and that of the fin portions 32a around the center and the air ducts 42 and 43 provided on both sides thereof in the radiation fin 32 are in an alternate relation along the Y-axis direction (crosstie direction) as a whole. That is, the positions of the air ducts 42 and 43 of the radiation fin 32 are different from the position of the air duct 41 of the radiation fin 31 in the crosstie direction (Y-axis direction).

The air duct 41 of the radiation fin 31 is provided on a central region (where the centerline 150 is present) of the radiation fin 31 in the Y-axis direction, so that air (fresh air of the traveling wind) circulated (bypassed) through the air duct 41 to be discharged is supplied to end portions 32c of the 16 fin portions 32a provided on a position corresponding to the central region of the radiation fin 32 in the Y-axis direction when the railway vehicle 10 travels with the radiation fin 31 at the forefront (on the windward side) in the traveling direction. Further, air (heat-exchanged and warmed high-temperature air) circulated through the 13 fin portions 31a and the 13 fin portions 31a other than the air duct 41 to be discharged is circulated through the air ducts 42 and 43 of the radiation fin 32 and discharged to the downstream side of the radiation fin 32.

According to the first embodiment, the width W4 of the range of formation of the 16 fin portions 32a of the radiation fin 32 along the Y-axis direction is broader than the width W1 of the air duct 41. With reference to the radiation fin 32, the width W2 of the ranges (two portions) of formation of the 13 fin portions 31a and the 13 fin portions 31a of the radiation fin 31 along the Y-axis direction is broader than the width W5 of each of the air ducts 42 and 43. In the radiation fin 31, the width W1 of the air duct 41 along the Y-axis direction is smaller than the width W2 of the 13 fin portions 31a and the 13 fin portions 31a other than the air duct 41.

In the radiation fin 32, the air duct 42 is provided in the vicinity of (inside) an end portion 32e of the radiation fin 32 along arrow Y2 in the Y-axis direction, while the air duct 43 is provided in the vicinity of (inside) another end portion 32f of the radiation fin 32 along arrow Y1. In other words, the air ducts 42 and 43 are provided on regions close to both end portions of the radiation fin 32 in the crosstie direction (Y-axis direction).

According to the first embodiment, air (traveling wind) taken from a side end portion 32g of the radiation fin 32 along arrow Y2 in the traveling direction (along arrow X1) is supplied to the five fin portions 32a provided on a region of the end portion 32e beyond the air duct 42 in the Y-axis direction while air (traveling wind) taken from another side end portion 32h of the radiation fin 32 along arrow Y1 in the traveling direction (along arrow X1) is supplied to the five fin portions 32a provided on a region of the end portion 32f beyond the air duct 43 in the crosstie direction when the railway vehicle 10 travels with the radiation fin 31 at the forefront in the traveling direction, as shown in FIG. 3. Thus, air taken from both sides (along arrows Y1 and Y2) of the radiation fin 32 is directly supplied to the five fin portions 32a and the five fin portions 32a provided on both end portions of the radiation fin 32.

When observing the radiation fins 31 and 32 as a whole, the arrangement structure of the air duct 41 and the fin portions 31a provided on both sides thereof in the radiation fin 31 and that of the fin portions 32a around the center of the radiation fin 32, the air ducts 42 and 43 provided on both sides thereof and the fin portions 32a provided on outer sides thereof have shapes symmetrical with respect to the centerline 150 in the Y-axis direction.

According to the first embodiment, therefore, part of air taken from an end portion 31d of the radiation fin 31 at the forefront in the traveling direction and circulated (bypassed) through the air duct 41 to be discharged is supplied to the end portion 32c of the radiation fin 32 in the traveling direction when the railway vehicle 10 travels along arrow X1 (the first traveling direction). At the same time, air circulated through the fin portions 31a provided on both sides of the air duct 41 is circulated through the air ducts 42 and 43 of the radiation fin 32 respectively and discharged along arrow X2. When the railway vehicle 10 travels along arrow X2 (a second traveling direction opposed to the first traveling direction), on the other hand, part of air taken from another end portion 32d of the radiation fin 32 at the forefront in the traveling direction and circulated (bypassed) through the air ducts 42 and 43 to be discharged is supplied to an end portion 31c of the radiation fin 31 in the traveling direction. At the same time, air circulated through the fin portions 32a on the central region other than the air ducts 42 and 43 to be discharged is circulated through the air duct 41 of the radiation fin 31 and discharged along arrow X1. The end portions 31c and 32c are examples of the "end portion in the traveling direction" in the scope of claims for patent.

The radiation fin 31 has no fin portions in the air duct 41, and hence the flow velocity of air circulated through the air duct 41 is higher than that of air passing through the fin portions 31a. Therefore, the heat transfer rate to air in the fin portions 31a facing (bordering) the air duct 41 along arrows Y1 and Y2 is larger (higher) than the heat transfer rate to air in the inner fin portions 31a adjacent thereto. This also applies to the radiation fin 32. In other words, the heat transfer rate to the air in the fin portions 32a forming both sides of the air duct 42 and the heat transfer rate to the air in the fin portions 32a forming both sides of the air duct 43 are larger (higher) than the heat transfer rate to the air in the region of the inner fin portions 32a arranged adjacently thereto. Further, air (fresh air) passing through the air duct 41 at a high flow velocity is supplied to the end portions 32c of the fin portions 32a, while air (fresh air) passing through the air ducts 42 and 43 at a high flow velocity is supplied to the end portions 31c of the fin portions 31a. This also improves the heat transfer rate to the air in the whole of the fin portions 31a and 32a. Consequently, radiation performances of the respective ones of the radiation fins 31 and 32 are maintained at high levels in the cooling portion 30 due to the provision of the air ducts 41 to 43.

Thus, when the railway vehicle 10 travels along arrow X1, the radiation fin 31 (the 13 fin portions 31a and the 13 fin portions 31a on the left and right sides) exhibits an excellent cooling performance due to heat exchange with the fresh air (traveling wind) having a relatively low temperature, while the fresh air circulated (bypassed) through the air duct 41 can be supplied to the 16 fin portions 32a on the central region of the radiation fin 32 at the rear stage (on the downstream side). In other words, the fresh air bypassed through the air duct 41 is so supplied to the 16 fin portions 32a on the central region of the radiation fin 32 that the cooling performance (radiation performance) of the radiation fin 32 can be maintained at a level equivalent to that of the radiation fin 31 provided on the upstream side, dissimilarly to a case where air (high-temperature air) warmed in the radiation fin 31 is uniformly supplied to the radiation fin 32 provided at the rear stage (on the downstream side). As shown in FIGS. 3 and 4, the radiation fin 31 is provided with 12 heat pipes 5 in total. More specifically, wick-type heat pipes 5 are embedded in a connection region of the radiation fin 31 with the semiconductor device 20, as shown in FIG. 4. Wicks (cores) having meshed capillary structures are inserted into the heat pipes 5 along inner walls of metallic pipes, which are charged with a working fluid such as water, alcohol or alternative chlorofluorocarbon after evacuated in a state where both end portions thereof are sealed. The temperatures of the sealed both end portions of the metallic pipes are so rendered different that the working fluid is circulated in the metallic pipes while repeating evaporation and condensation, whereby the heat pipes 5 serve as heat transport devices transporting a large quantity of heat from a high-temperature portion to a low-temperature portion due to latent heat transfer following the evaporation and condensation of the working fluid.

According to the first embodiment, the respective heat pipes 5 (shown by broken lines) extend in the Y-axis direction over the regions provided with the plurality of fin portions 31a and the air duct 41, as shown in FIG. 3. In this case, six heat pipes 5 extend from a rear-side portion of the air duct 41 along arrow Y1 up to rear-side portions of the fin portions 31a along arrow Y1 while the remaining six heat pipes 5 extend from the rear-side portion of the air duct 41 along arrow Y2 up to rear-side portions of the fin portions 31a along arrow Y2. Thus, heat (exhaust heat) transmitted from the semiconductor device 20 to the radiation fin 31 is not filled in a connection region 31j between the rear-side portion of the air duct 41 and the semiconductor device 20 but is transported to connection regions 31j between the 13 fin portions 31a along arrow Y1 other than the air duct 41 and the semiconductor device 20 and between the 13 fin portions 31a along arrow Y2 and the semiconductor device 20 respectively. Therefore, the bottom surface of the air duct 41 is prevented from abnormal heat generation.

Similarly, 12 heat pipes 5 (six along arrow Y1 and six along arrow Y2) are embedded in a connection region 32j of the radiation fin 32. Thus, heat (exhaust heat) transmitted from the semiconductor device 20 to the radiation fin 32 is not filled in a connection region 32j between a rear-side portion of the air duct 42 (and 43) and the semiconductor device 20 but transported to connection regions 32j between the eight fin portions 32a along arrow Y2 and the eight fin portions 32a along arrow Y1 and the semiconductor device 20 respectively. The power conversion device 100 according to the first embodiment is configured in the aforementioned manner.

(Effects of First Embodiment)

According to the first embodiment, the following effects can be attained:

According to the first embodiment, as hereinabove described, the radiation fin 31 is provided with the air duct 41 extending along the traveling direction by partially not providing the plurality of fin portions 31a. At the time of traveling of the railway vehicle 10, part of air taken from the end portion 31d of the radiation fin 31 in the traveling direction and circulated through the air duct 41 to be discharged is supplied to the end portion 32c of the radiation fin 32 in the traveling direction. Thus, when the railway vehicle 10 travels with the radiation fin 31 at the forefront (on the windward side), the radiation fin 31 exhibits an excellent cooling performance due to heat exchange with fresh air (traveling wind) having a relatively low temperature while the fresh air circulated (bypassed) through the air duct 41 can be supplied to the radiation fin 32 at the rear stage (on the downstream side). In other words, the fresh air (low-temperature air) is so supplied to the radiation fin 32 that the radiation performance of the radiation fin 32 can be maintained at a level equivalent to that of the radiation fin 31 provided on the upstream side, dissimilarly to a case where air (high-temperature air) warmed in the radiation fin 31 is supplied to the radiation fin 32 at the rear stage (on the downstream side). Consequently, the cooling performances (radiation performances) of the respective ones of the radiation fins 31 and 32 can be leveled.

According to the first embodiment, the radiation fin 31 is provided with the air duct 41, while the radiation fin 32 is provided with the air ducts 42 and 43 on the positions different from the air duct 41 in the crosstie direction (Y-axis direction) orthogonal to the traveling direction. Further, the radiation fin 32 is provided with the plurality of (16) fin portions 32a on the position opposed to the air duct 41 in the traveling direction, while the radiation fin 31 is provided with the plurality of (13) fin portions 31a and the plurality of (13) fin portions 31a on the positions opposed to the air ducts 42 and 43 in the traveling direction. Thus, when the railway vehicle 10 travels with the radiation fin 31 at the forefront (on the windward side), fresh air circulated (bypassed) through the air duct 41 can be reliably supplied to the plurality of (16) fin portions 32a (heat-exchange regions) of the radiation fin 32 provided at the rear stage (on the downstream side). When the railway vehicle 10 travels with the radiation fin 32 at the forefront, on the other hand, fresh air circulated bypassed) through the air ducts 42 and 43 can be reliably supplied to the plurality of (13) fin portions 31a (heat-exchange regions) and the plurality of (13) fin portions 31a (heat-exchange regions) of the radiation fin 31 at the rear stage. Therefore, the cooling performances (radiation performances) of the respective ones of the radiation fins 31 and 32 can be both leveled regardless of the traveling direction (running direction) of the railway vehicle 10.

According to the first embodiment, the air duct 41 is provided on the central region of the radiation fin 31 in the crosstie direction (Y-axis direction), so that air circulated through the air duct 41 to be discharged is supplied to the end portions 32c of the plurality of (16) fin portions 32a provided on the position corresponding to the central region of the radiation fin 32 in the crosstie direction (Y-axis direction) and air circulated through the plurality (13) of fin portions 31a and the plurality (13) of fin portions 31a other than the air duct 41 to be discharged is circulated through the air ducts 42 and 43 of the radiation fin 32 and discharged when the railway vehicle 10 travels with the radiation fin 31 at the forefront in the traveling direction. Thus, when the railway vehicle 10 travels with the radiation fin 31 at the forefront, fresh air circulated through the air duct 41 provided on the central region of the radiation fin 31 in the crosstie direction (Y-axis direction) can be reliably supplied to the 16 fin portions 32a positioned on the central region of the rear-stage radiation fin 32 in the crosstie direction (Y-axis direction). Further, warm air heat-exchanged through the fin portions 31a in the radiation fin 31 can be easily circulated through the air ducts 42 and 43 provided on the radiation fin 32 and discharged toward the downstream side of the radiation fin 32. Also when the railway vehicle 10 travels with the radiation fin 32 at the forefront, effects similar to the above can be attained, with the exception that the direction of the traveling wind is reversed.

According to the first embodiment, the range of formation (the width W4) of the fin portions 32a of the radiation fin 32 provided on the position opposed to the air duct 41 in the crosstie direction (Y-axis direction) is rendered broader than the width W1 of the air duct 41 in the crosstie direction (Y-axis direction). Further, the range of formation (the width W2) of the fin portions 31a of the radiation fin 31 provided on the positions opposed to the air ducts 42 and 43 in the crosstie direction (Y-axis direction) is rendered broader than the width W5 of each of the air ducts 42 and 43 in the crosstie direction (Y-axis direction). Thus, fresh air (traveling wind) circulated through the air duct 41 (or the air ducts 42 and 43) to be diffused and discharged toward the downstream side can be effectively supplied to the plurality of fin portions 32a (or the plurality of fin portions 31a) of the radiation fin 32 (or the radiation fin 31) having the width (the range of formation) broader than the width of the air duct 41 (or the air ducts 42 and 43), regardless of the traveling direction of the railway vehicle 10. Therefore, heat exchange with the fresh air can be reliably performed also in the radiation fin 32 (or the radiation fin 31) provided on the downstream side (at the rear stage).

According to the first embodiment, the width W1 of the air duct 41 along the crosstie direction (Y-axis direction) is rendered smaller than the width W2 of the range of formation of the fin portions 31a other than the air duct 41 in the radiation fin 31. Thus, also when the radiation fin 31 is provided with the air duct 41 having no fin portions 31a, a sufficient range of formation can be ensured for the fin portions 31a (heat-exchange regions) other than the air duct 41, whereby fresh air can be supplied to the plurality of (16) fin portions 32a of the radiation fin 32 through the air duct 41 without remarkably lowering the cooling performance of the radiation fin 31.

According to the first embodiment, the air ducts 42 and 43 are provided on the sides of the end portions 32e and 32f of the radiation fin 32 in the crosstie direction (Y-axis direction) in the radiation fin 32. Thus, the 16 fin portions 32a (heat-exchange regions) for receiving fresh air (traveling wind) supplied from the air duct 41 can be easily provided on the central region of the radiation fin 32 in the crosstie direction (Y-axis direction).

According to the first embodiment, the air ducts 42 and 43 are provided in the vicinity of both end portions of the radiation fin 32 in the crosstie direction (Y-axis direction). Thus, the pair of air ducts 42 and 43 provided in the vicinity of both end portions of the radiation fin 32 in the crosstie direction (Y-axis direction) can hold the plurality of (16) fin portions 32a (heat-exchange regions) provided on the central region of the radiation fin 32 in the crosstie direction (Y-axis direction) from both sides, whereby heat exchange with the fresh air supplied from the air duct 41 can be reliably performed in the 16 fin portions 32a (heat-exchange regions) of the radiation fin 32.

According to the first embodiment, air taken from the side end portions 32g and 32h of the radiation fin 32 in the traveling direction is supplied to the plurality of fin portions 31a provided on the regions close to the end portions 32e and 32f in the crosstie direction (Y-axis direction) beyond the air ducts 42 and 43 when the railway vehicle 10 travels with the radiation fin 31 at the forefront in the traveling direction. Thus, not only fresh air (traveling wind) supplied through the air duct 41 but also air (fresh air) taken from the side end portions 32g and 32h of the radiation fin 32 in the traveling direction can be supplied to the plurality of fin portions 32a (additional heat-exchange regions) provided outside the air ducts 42 and 43 (on end regions in the crosstie direction (Y-axis direction)) for heat exchange. Consequently, the cooling performance of the radiation fin 32 can be maintained at a high level.

According to the first embodiment, the power conversion device 100 includes the heat pipes 5 provided within the connection region 31j of the radiation fin 31, including the air duct 41, with the semiconductor device 20 to extend in the crosstie direction (Y-axis direction) over the regions provided with the plurality of (13) fin portions 31a and the plurality of (13) fin portions 31a and the region provided with the air duct 41. The power conversion device 100 further includes the heat pipes 5 provided within the connection region 32j of the radiation fin 32, including the air ducts 42 and 43, with the semiconductor device 20 to extend in the crosstie direction (Y-axis direction) over the regions provided with the plurality of (16) fin portions 32a and the regions provided with the air ducts 42 and 43. Thus, the heat (exhaust heat) transmitted from the semiconductor device 20 to the radiation fin 31 or 32 is not filled in the connection region 31j (or 32j) between the rear-side portion(s) of the air duct 41 (or the air ducts 42 and 43) and the semiconductor device 20 but transported to the connection regions 31j (or 32j) of the plurality of fin portions 31a (or 32a) other than the air duct 41 (or the air ducts 42 and 43) and the semiconductor device 20 through the heat pipes 5. Therefore, the bottom surface(s) of the air duct 41 (or the air ducts 42 and 43) can be effectively prevented from abnormal heat generation. Further, heat can be efficiently radiated from the semiconductor device 20 through the plurality of fin portions 31a and the plurality of fin portions 32a (heat-exchange regions) other than the air duct 41 and the air ducts 42 and 43.

According to the first embodiment, the arrangement structure of the plurality of (13) fin portions 31a and the plurality of (13) fin portions 31a and the air duct 41 in the radiation fin 31 and that of the plurality of (16) fin portions 32a and the air ducts 42 and 43 in the radiation fin 32 have shapes symmetrical with respect to the centerline 150 in the crosstie direction (Y-axis direction). Thus, heat radiation characteristics of the radiation fins 31 and 32 along the crosstie direction (Y-axis direction) can be rendered symmetrical with respect to the centerline 150 along the traveling direction. When observing the radiation fins 31 and 32 as a single cooler (the cooling portion 30), therefore, the cooler can be prevented from local deviation of heat radiation characteristics. Therefore, the overall cooling performance (radiation performance) of the cooler provided in the railway vehicle 10 can be maintained at a constant level without being remarkably influenced by traveling conditions of the railway vehicle 10 and the strength of traveling wind.

According to the first embodiment, the air ducts 42 and 43 are provided on the positions of the radiation fin 32 different from the air duct 41 in the crosstie direction (Y-axis direction). Thus, when the fin portions 31a and 32a provided on the radiation fins 31 and 32 respectively extend toward the vertical direction (Z-axis direction) of the railway vehicle 10, the cooling performances (radiation performances) of the respective ones of the radiation fins 31 and 32 can be both leveled regardless of the traveling direction (running direction) of the railway vehicle 10.

According to the first embodiment, the radiation fins 31 and 32 are set in the underfloor space 11a of the railway vehicle 10, while the fin portions 31a and 32a provided on the radiation fins 31 and 32 extend toward a lower portion of the railway vehicle 10 (along arrow Z2). Thus, the radiation fins 31 and 32, whose cooling performances (radiation performances) for cooling the semiconductor device 20 can be effectively leveled, can be easily set when a sufficient space for setting the radiation fins 31 and 32 is present under the semiconductor device 20 (along arrow Z2) in the railway vehicle 10 having the underfloor space 11a for setting the power conversion device 100 (the semiconductor device 20).

[Second Embodiment]

A power conversion device 200 according to a second embodiment of the present invention is now described with reference to FIGS. 1, 5 and 6. According to the second embodiment, a wind guide member 50 is further provided in a space S between radiation fins 31 and 32. FIGS. 5 and 6 show portions similar in structure to those of the aforementioned first embodiment with the same reference signs.

The power conversion device 200 (see FIG. 1) according to the second embodiment of the present invention includes a cooling portion 230, as shown in FIG. 6. The wind guide member 50 is set for the pair of radiation fins 31 and 32 of the cooling portion 230. In other words, the wind guide member 50 is provided in the space S between the radiation fins 31 and 32, as shown in FIGS. 5 and 6. The wind guide member 50 is configured to have four sidewalls 51 to 54. The sidewalls 51 to 54 are examples of the "wind guide wall" in the scope of claims for patent.

When observed along arrow X2, the sidewall 51 connects end portions 31c (along arrow X1) of fin portions 31a with an inlet 6 (along arrow X2) of an air duct 42 provided on a position opposed to the fin portions 31*a* in a traveling direction along arrow Y2, as shown in FIG. 5. The sidewall 52 connects the end portions 31*c* of the fin portions 31*a* with the inlet 6 of the air duct 42 along arrow Y1. The sidewall 52 also connects an outlet 7 (along arrow X1) of the air duct 41 with end portions 32*c* (along arrow X2) of fin portions 32*a* provided on positions opposed to the air duct 41 in the traveling direction. The sidewall 53 connects the outlet 7 of the air duct 41 with the end portions 32*c* of the fin portions 32*a* provided on the positions opposed to the air duct 41 in the traveling direction along arrow Y2. The sidewall 53 also connects the end portions 31*c* (along arrow X1) of the fin portions 31*a* with an inlet 8 (along arrow X2) of another air duct 43 provided on a position opposed to the fin portions 31*a* in the traveling direction. The sidewall 54 connects the end portions 31*c* of the fin portions 31*a* with the inlet 8 of the air duct 43 along arrow Y1. The sidewalls 51 and 52 constitute an air duct 61, the sidewalls 52 and 53 constitute another air duct 62 adjacent to the air duct 61 along arrow Y2, and the sidewalls 53 and 54 constitute still another air duct 63 adjacent to the air duct 62 along arrow Y2.

According to the second embodiment, the sidewalls 51 to 54 extend outward (downward) beyond forward end portions (lower end portions) 31*b* of the fin portions 31*a* of the radiation fin 31 in a Z-axis direction and outward (downward) beyond forward end portions (lower end portions) 32*b* of the fin portions 32*a* of the radiation fin 32 in the Z-axis direction, as shown in FIG. 6. The air duct 62 is so formed that the width W6 in a crosstie direction (Y-axis direction) gradually increases from the outlet 7 of the air duct 41 toward the end portions 32*c* of the fin portions 32*a*, as shown in FIG. 5. Similarly, the air ducts 61 and 63 are so formed that the widths W7 in the crosstie direction (Y-axis direction) gradually increase from the outlets 6 and 8 of the air ducts 42 and 43 toward the end portions 31*c* of the fin portions 31*a* respectively.

Thus, when a railway vehicle 10 travels with the radiation fin 31 at the forefront in the traveling direction, the air duct 62 guides part of air taken from the end portion 31*d* of the radiation fin 31 and circulated through the air duct 41 to be discharged to 16 fin portions 32*a* on the end portion 32*c* of the radiation fin 32 as a function of the wind guide member 50, as shown in FIG. 5. In addition thereto, the air ducts 61 and 63 discharge air taken through the end portion 31*d* of the radiation fin 31 from the end portion 31*c* and guide the same to the air ducts 42 and 43 of the radiation fin 32 respectively.

When the railway vehicle 10 travels along arrow X2, on the other hand, the wind guide member 50 guides part of air taken from the end portion 32*d* of the radiation fin 32 at the forefront in the traveling direction and circulated through the air ducts 42 and 43 to be discharged to 13 fin portions 31*a* of the radiation fin 31 through the air ducts 61 and 63 respectively and guides air circulated through 16 fin portions 32*a* of the radiation fin 32 to be discharged to the air duct 41 of the radiation fin 31 through the air duct 62, although FIG. 5 does not show the flow of wind in this case. In addition thereto, the wind guide member 50 discharges air circulated through five fin portions 32*a* of each of regions of the radiation fin 32 along arrows Y1 and Y2 to be discharged outward from outer wall surfaces of the sidewalls 54 and 51 without guiding the same to the fin portions 31*a* of the radiation fin 31. The remaining structure of the power conversion device 200 according to the second embodiment is similar to that of the power conversion device 100 according to the aforementioned first embodiment.

(Effects of Second Embodiment)

According to the second embodiment, as hereinabove described, the air duct 62 provided in the space S for guiding part of air taken from the end portion 31*d* of the radiation fin 31 and circulated through the air duct 41 to be discharged to the fin portions 32*a* on the end portion 32*c* of the radiation fin 32 and the air ducts 61 and 63 guiding air taken from the end portion 31*d* of the radiation fin 31 to the air ducts 42 and 43 of the radiation fin 32 respectively constitute the wind guide member 50. Thus, when the railway vehicle 10 travels with the radiation fin 31 at the forefront (on the windward side), fresh air circulated (bypassed) through the air duct 41 can be reliably supplied to the 16 fin portions 32*a* of the radiation fin 32 at the rear stage (on the downstream side). Also when the railway vehicle 10 travels with the radiation fin 32 at the forefront (on the windward side), fresh air circulated through the air ducts 42 and 43 can be reliably supplied to a plurality of (13) fin portions 31*a* and a plurality of (13) fin portions 31*a* of the radiation fin 31 at the rear stage (on the downstream side). Further, the wind guide member 50 (sidewalls 52 and 53) can separate the flow of fresh air (low-temperature air) circulated through the air duct 41 (or the air ducts 42 and 43) and supplied to the radiation fin 32 (or the radiation fin 31) and the flow of air (high-temperature air) heat-exchanged and warmed in the radiation fin 31 (or the radiation fin 32) from each other. Thus, the roles of the air ducts 42 and 43 (or the air duct 41) and those of the fin portions 32*a* (or the fin portions 31*a*) (heat-exchange regions) can be clearly distinguished from each other to effectively function respectively in the radiation fin 32 (or the radiation fin 31) at the rear stage (on the downstream side).

According to the second embodiment, the wind guide member 50 is so configured as to connect the outlet 7 of the air duct 41 with the end portions 32*c* of the fin portions 32*a* provided on the positions opposed to the air duct 41 in the traveling direction in the space S. The wind guide member 50 is also so configured as to connect the outlets 6 and 8 of the air ducts 42 and 43 with the end portions 31*c* of the fin portions 31*a* provided on the positions opposed to the air ducts 42 and 43 in the traveling direction. Thus, fresh air (low-temperature air) circulated through the air duct 41 and supplied to the radiation fin 32 can be supplied to the end portions 32*c* of the fin portions 32*a* without leaking outward from the end portions 32*c* of the fin portions 32*c* of the radiation fin 32 (on the downstream side). Further, fresh air (low-temperature air) circulated through the air ducts 42 and 43 and supplied to the radiation fin 31 can be supplied to the end portions 31*c* of the plurality of fin portions 31*a* without leaking outward from the end portions 31*c* of the fin portions 31*a* of the radiation fin 31 (on the downstream side). In addition, the flow of fresh air (low-temperature air) circulated through the air duct 41 (or the air ducts 42 and 43) and supplied to the radiation fin 32 (or the radiation fin 31) and the flow of air (high-temperature air) heat-exchanged and warmed in the radiation fin 31 (or the radiation fin 32) can be more reliably separated from each other.

According to the second embodiment, the sidewalls 51 to 54 are configured to extend downward beyond the lower end portions 31*b* and 32*b* of the fin portions 31*a* and 32*a* of the radiation fins 31 and 32. In other words, the sidewalls 51 to 54 are configured to extend outward beyond the forward end portions of the fin portions 31*a* and 32*a* of the radiation fins 31 and 32 in the direction (Z-axis direction) orthogonal to the traveling direction with respect to the wind guide member 50. Thus, the flow of low-temperature air circulated through the air duct 41 (or the air ducts 42 and 43) and supplied to the radiation fin 32 (or the radiation fin 31) and the flow of high-temperature air heat-exchanged and warmed in the radiation fin 31 (or the radiation fin 32) can be more reliably inhibited from leaking to regions other than that between the radiation fins 31 and 32 and mixing with each other.

According to the second embodiment, the width W6 of the air duct 62 in the direction (Y-axis direction) orthogonal to the traveling direction gradually increases from the outlet 7 of the air duct 41 toward the end portions 32c of the fin portions 32a, and the widths W7 of the air ducts 61 and 63 gradually increase from the outlets 6 and 8 of the air ducts 42 and 43 toward the end portions 31c of the fin portions 31a in the cross-tie direction (Y-axis direction) respectively. Thus, when the railway vehicle 10 travels with the radiation fin 31 at the forefront (on the windward side), fresh air circulated through the air duct 41 can be uniformly supplied over the whole region (heat-exchange region) of the range of formation of the fin portions 32a of the radiation fin 32, whereby the cooling performance (radiation performance) of the radiation fin 32 can be maintained at a high level. Also when the railway vehicle 10 travels with the radiation fin 32 at the forefront, effects similar to the above can be attained, with the exception that the direction of the traveling wind is reversed. The remaining effects of the second embodiment are similar to those of the aforementioned first embodiment.

[Third Embodiment]

Figure 7:
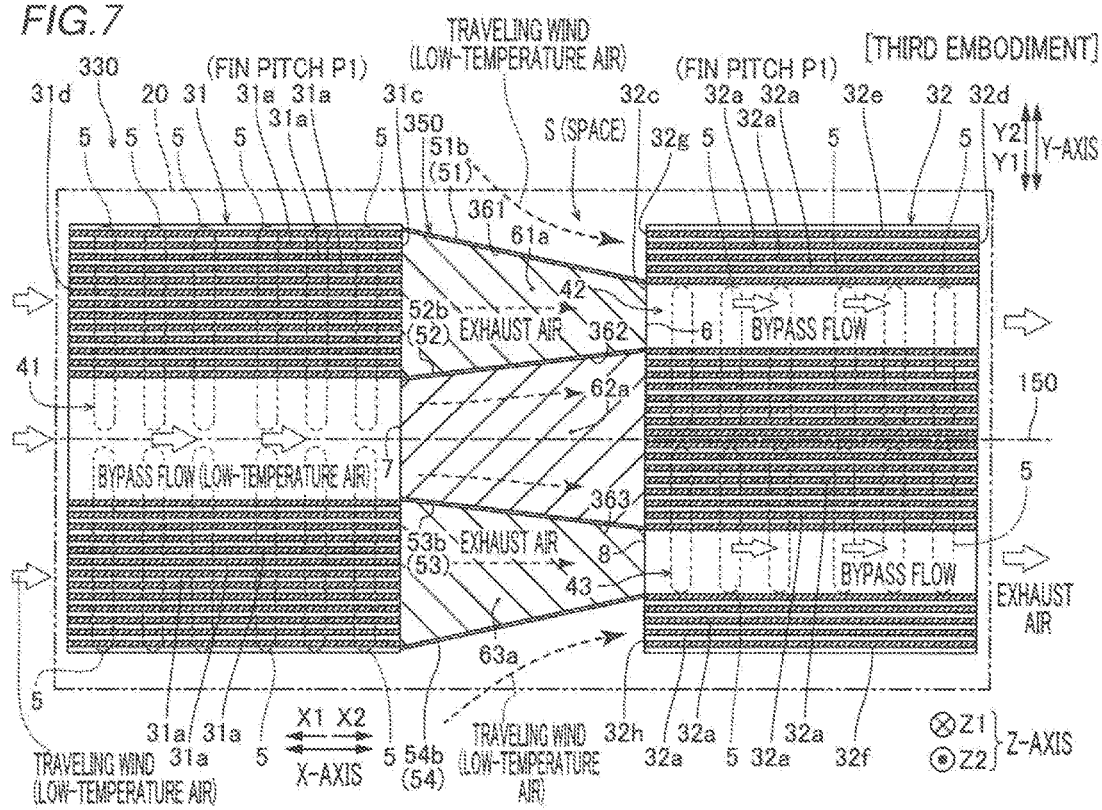
FIG. 7 is a bottom plan view showing a cooling structure of a power conversion device according to a third embodiment of the present invention.
Figure 8:
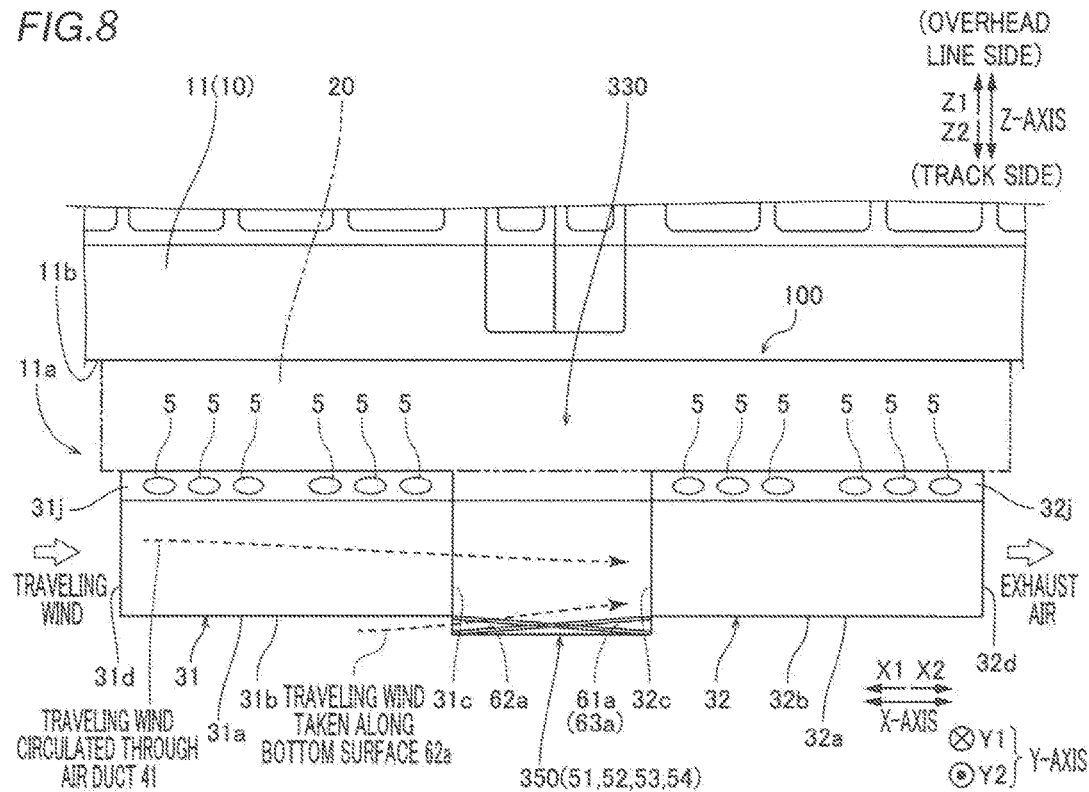
FIG. 8 is a side elevational view showing the cooling structure of the power conversion device according to the third embodiment of the present invention.

A power conversion device 300 according to a third embodiment of the present invention is now described with reference to FIGS. 1, 7 and 8. According to the third embodiment, a wind guide member 350 is configured to have bottom surfaces 61a to 63a. FIGS. 7 and 8 show portions similar in structure to those of the aforementioned second embodiment with the same reference signs.

The power conversion device 300 (see FIG. 1) according to the third embodiment of the present invention includes a cooling portion 330, as shown in FIGS. 7 and 8. The wind guide member 350 is set for a pair of radiation fins 31 and 32 of the cooling portion 330.

According to the third embodiment, the wind guide member 350 has the bottom surfaces 61a to 63a (shown in a hatched manner for the sake of convenience), as shown in FIG. 7. More specifically, an air duct 361 has the bottom surface 61a connecting lower end portions 51b and 52b of a pair of sidewalls 51 and 52 with each other. Another air duct 362 has the bottom surface 62a connecting lower end portions 52b and 53b of another pair of sidewalls 52 and 53 with each other. Still another air duct 363 has the bottom surface 63a connecting lower end portions 53b and 54b of still another pair of sidewalls 53 and 54 with each other.

As shown in FIG. 8, the bottom surface 62a (shown by broken lines) is inclined upward (toward the upper right) from a position downward (along arrow Z2) beyond an outlet 7 of an air duct 41 to approach toward a vertical position corresponding to end portions 32c of fin portions 32a provided on positions opposed to the air duct 41 (see FIG. 7) in the traveling direction in a space S. The bottom surface 61a (shown by broken lines) is inclined upward (toward the upper left) from a position downward beyond an outlet 6 of an air duct 42 (see FIG. 7) to approach toward a vertical position corresponding to end portions 31c of fin portions 31a provided on positions opposed to the air duct 42 in the traveling direction in the space S. Further, the bottom surface 63a (shown by broken lines) is inclined upward (toward the upper left) from a position downward beyond an outlet 8 of an air duct 43 (see FIG. 7) to approach toward a vertical position corresponding to end portions 31c of fin portions 31a provided on positions opposed to the air duct 43 in the space S. In the wind guide member 350, therefore, the bottom surfaces 61a to 63a form lower surfaces of the air ducts 361 to 363 in a state where the directions of inclinations are alternated.

Thus, when the railway vehicle 10 travels with the radiation fin 31 at the forefront, not only fresh air circulated through the air duct 41 but also traveling wind flowing under the radiation fin 31 can be collected through the air duct 362 (see FIG. 7) and supplied to the radiation fin 32 (fin portions 32a) at the rear stage. When the railway vehicle 10 travels along arrow X2 with the radiation fin 32 at the forefront, on the other hand, not only fresh air circulated through the air ducts 42 and 43 but also traveling wind flowing under the radiation fin 32 can be collected through the air ducts 361 and 363 (see FIG. 7) and supplied to the radiation fin 31 (fin portions 31a) at the rear stage, although FIG. 7 does not show the flow of wind in this case. The remaining structure of the power conversion device 300 is similar to that of the power conversion device 200 according to the aforementioned second embodiment.

(Effects of Third Embodiment)

According to the third embodiment, as hereinabove described, the air duct 362 of the wind guide member 350 is provided with the bottom surface 62a inclined from the position outward (downward) beyond the outlet 7 of the air duct 41 in the direction (Z-axis direction) orthogonal to the traveling direction to approach toward the position corresponding to the end portions 32c of the fin portions 32a provided on the positions opposed to the air duct 41 in the traveling direction in the space S. Thus, when the railway vehicle 10 travels with the radiation fin 31 at the forefront, not only fresh air circulated through the air duct 41 but also traveling wind flowing outward (downward) beyond the position of the outlet 7 of the air duct 41 of the radiation fin 31 in the Z-axis direction can be collected through the air duct 362 of the wind guide member 350 and supplied to the radiation fin 32 at the rear stage. Thus, a larger quantity of fresh air can be supplied to the end portions 32c of the fin portions 32a (heat-exchange regions) of the radiation fin 32 at the rear stage. Also when the railway vehicle 10 travels with the radiation fin 32 at the forefront, effects similar to the above can be attained, with the exception that the direction of the traveling wind is reversed. The remaining effects of the third embodiment are similar to those of the aforementioned second embodiment.

[Fourth Embodiment]

A power conversion device 400 according to a fourth embodiment of the present invention is now described with reference to FIGS. 1, 3 and 9. According to the fourth embodiment, a radiation fin 431 (432) has a fin pitch P2 smaller than the fin pitch P1 (see FIG. 3) of the radiation fin 31 (32) of the power conversion device 100 according to the aforementioned first embodiment. FIG. 9 shows portions similar in structure to those of the aforementioned first embodiment with the same reference signs.

The power conversion device 400 (see FIG. 1) according to the fourth embodiment of the present invention includes a cooling portion 430, as shown in FIG. 9. The cooling portion 430 has a pair of radiation fins 431 and 432.

According to the fourth embodiment, the radiation fin 431 is provided with fin portions 431a along arrows Y1 and Y2 with respect to an air duct 41 extending in an X-axis direction about a centerline 150 with a width W1 in a Y-axis direction. While 36 fin portions 431a in total are present when no air duct 41 is provided, the fin portions 431a according to the fourth embodiment are provided at the fin pitch P2 smaller than the fin pitch P1 of the radiation fin 31 (32) of the aforementioned first embodiment, whereby the number of the fin portions 431a is kept at 36 identically to the fin portions 31a of the radiation fin 32 (see FIG. 3) in the aforementioned first embodiment. Similarly, the number of fin portions 432a of the radiation fin 432 is kept at 36 identically to the fin portions 32a of the radiation fin 32 (see FIG. 3) in the aforementioned first embodiment, despite provision of air ducts 42 and 43.

18 fin portions 431a and 18 fin portions 431a are provided on sides of the air duct 41 of the radiation fin 431 along arrows Y1 and Y2 respectively. Further, 24 fin portions 432a are provided on a central region of the radiation fin 432 opposed to the air duct 41, while six fin portions 423a and six fin portions 432a are provided on regions of the air ducts 42 and 43 along arrows Y2 and Y1 respectively. Thus, the fin portions 431a (432a) are provided at the fin pitch P2 smaller than the fin pitch P1 (the fin portions 431a (432a) are formed at denser intervals) at the same total number as the fin portions 31a (32a) of the radiation fin 31 (32), to constitute the cooling portion 430. The remaining structure of the power conversion device 400 according to the fourth embodiment is similar to that of the power conversion device 100 according to the aforementioned first embodiment.

(Effects of Fourth Embodiment)

According to the fourth embodiment, the fin portions 431a (432a) are formed at the fin pitch P2 smaller than the fin pitch P1 in the aforementioned first embodiment, to constitute the radiation fins 431 and 432 in the state where the air duct 41 (the air ducts 42 and 43) has 36 fin portions 431a (432a). Thus, the effective heat transfer area (total heat transfer areas of the fin portions 431a (432a)) of each of the radiation fins 431 and 432 can be maintained unreduced despite the provision of the air duct 41 (the air ducts 42 and 43), as compared with the case where the effective heat transfer area (total heat transfer areas of the fin portions 431a (432a)) is reduced due to reduction in the number of the fin portions resulting from the provision of the air duct 41 (the air ducts 42 and 43) in the aforementioned first embodiment. Therefore, the cooling performances (radiation performances) of the radiation fins 431 and 423 can be more improved as compared with those of the radiation fins 31 and 32. The remaining effects of the fourth embodiment are similar to those of the aforementioned first embodiment.

[Fifth Embodiment]

A power conversion device 500 according to a fifth embodiment of the present invention is now described with reference to FIGS. 1, 3, 9 and 10. According to the fifth embodiment, a wind guide member 50 (see FIG. 2) identical to that according to the aforementioned second embodiment is provided for radiation fins 431 and 432 (see FIG. 9) identical to those according to the aforementioned fourth embodiment.

The power conversion device 500 (see FIG. 1) according to the fifth embodiment of the present invention includes a cooling portion 530, as shown in FIG. 10. The wind guide member 50 is set for the pair of radiation fins 431 and 432 of the cooling portion 530.

Also according to the fifth embodiment, therefore, an air duct 62 guides part of air taken from an end portion 31d of the radiation fin 431 and circulated through an air duct 41 to be discharged to 24 fin portions 432a on an end portion 32c of the radiation fin 432 when a railway vehicle 10 travels with the radiation fin 431 at the forefront in the traveling direction. In addition, air ducts 61 and 63 guide air taken from the end portion 31d of the radiation fin 431 to air ducts 42 and 43 of the radiation fin 432 respectively. When the railway vehicle 10 travels along arrow X2, on the other hand, part of air taken from an end portion 32d of the radiation fin 432 at the forefront in the traveling direction and circulated through the air ducts 42 and 43 to be discharged is guided to fin portions 431a of the radiation fin 431 through the air ducts 61 and 63 while air circulated through fin portions 432a of the radiation fin 432 to be discharged is guided to the air duct 41 of the radiation fin 431 through the air duct 62, although FIG. 10 does not show the flow of wind in this case.

The effects of the fifth embodiment are similar to those of the aforementioned second and fourth embodiments.

[Sixth Embodiment]

Figure 11:
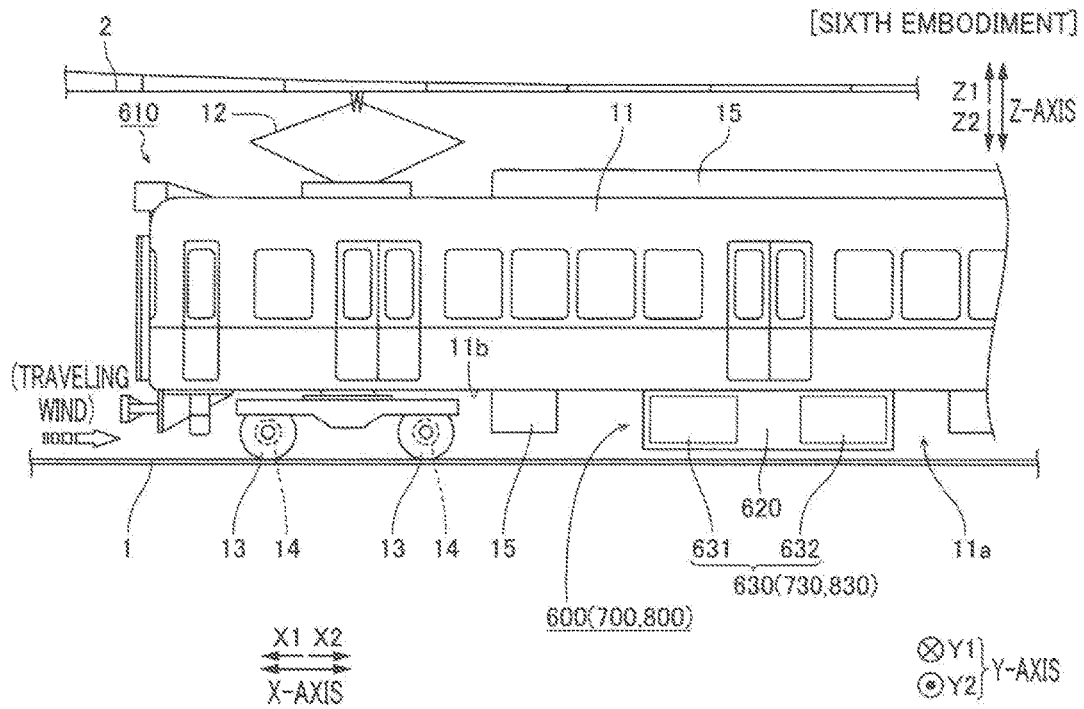
FIG. 11 is a side elevational view showing a railway vehicle according to a sixth embodiment of the present invention.
Figure 12:
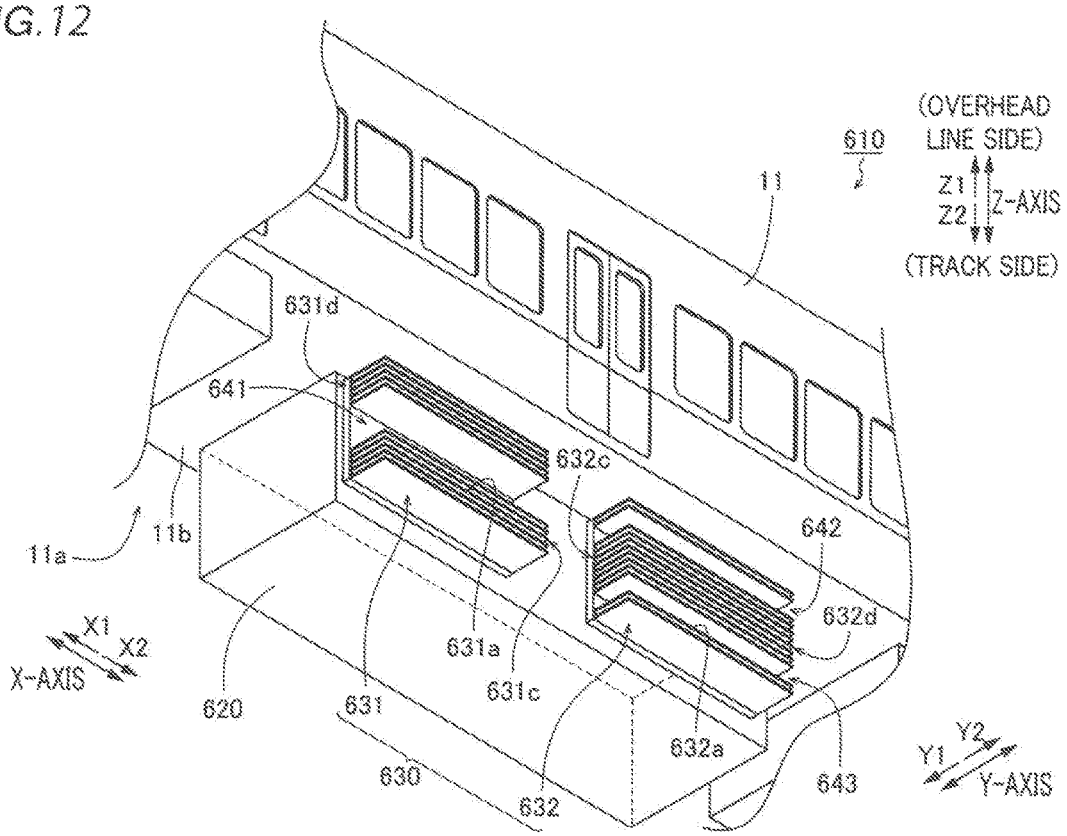
FIG. 12 is a perspective view of the railway vehicle according to the sixth embodiment of the present invention as viewed obliquely from below.
Figure 13:
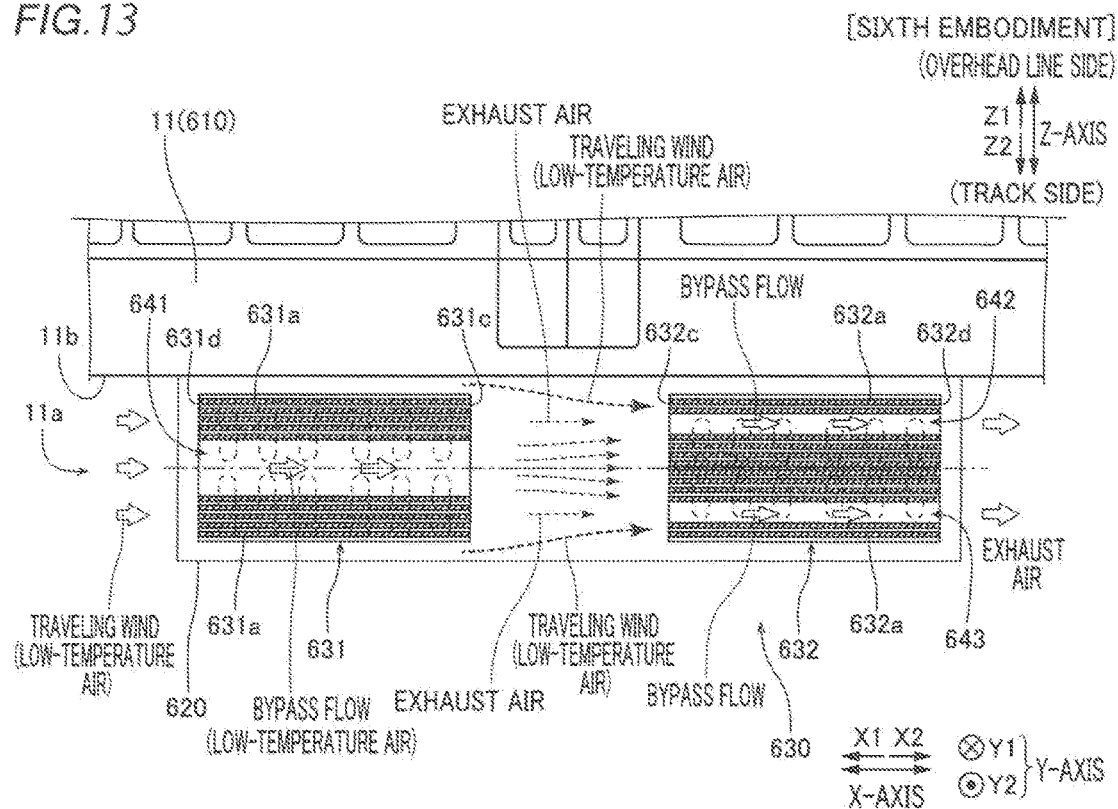
FIG. 13 is a side elevational view showing a cooling structure of a power conversion device according to the sixth embodiment of the present invention.

A power conversion device 600 according to a sixth embodiment of the present invention is now described with reference to FIGS. 11 to 13. According to the sixth embodiment, radiation fins 631 and 632 similar in structure to the radiation fins 31 and 32 according to the aforementioned first embodiment are provided to extend on a side portion of a semiconductor device 620. FIGS. 11 to 13 show portions similar in structure to those in the aforementioned first embodiment with the same reference signs.

The power conversion device 600 according to the sixth embodiment of the present invention includes the semiconductor device 600 and a cooling portion 630, as shown in FIGS. 11 and 12. The cooling portion 630 is arranged on a side surface (along arrow Y2) of the semiconductor device 620 fixed to a lower surface 11b of a vehicle body 11. The cooling portion 630 includes a radiation fin 631 (along arrow X1) and another radiation fin 632 (along arrow X2) arranged at a prescribed interval along an X-axis direction corresponding to the extensional direction of the vehicle body 11. The radiation fins 631 and 632 extend outward (along arrow Y2) from the side surface of the semiconductor device 620 along arrow Y2, and include a plurality of fin portions 631a and a plurality of fin portions 632a extending along the X-axis direction in the form of thin plates respectively. The semiconductor device 620 is an example of the "body of the power conversion device" in the scope of claims for patent. The radiation fins 631 and 632 are examples of the "first radiation fin" and the "second radiation fin" in the scope of claims for patent respectively.

When a railway vehicle 610 travels along arrow X1 as shown in FIG. 11, air around a track 1 is relatively carried along arrow X2 and blown toward the cooling portion 630 provided in an underfloor space 11a. In this case, traveling wind is circulated along arrow X2 through a clearance between the radiation fin 631 (the plurality of fin portions 631a) and the radiation fin 632 (the plurality of fin portions 632a) (see FIG. 12) extending in the X-axis direction. Thus, heat is discharged from the cooling portion 630 toward the atmospheric air. In the following description, it is assumed that the railway vehicle 610 travels along arrow X1 while the radiation fin 631 is arranged on the windward side (along arrow X1) in the traveling direction (running direction) and the radiation fin 632 is arranged on the leeward side (along arrow X2) serving as the rear stage.

According to the sixth embodiment, the radiation fin 631 includes an air duct 641 formed by partially not providing the plurality of fin portions 631a, as shown in FIGS. 12 and 13. The air duct 641 extends along the X-axis direction. The radiation fin 623 includes air ducts 642 and 643 formed by partially not providing the plurality of fin portions 632a. The air ducts 642 and 643 extend along the X-axis direction. The air duct 641 is an example of the "first air duct" in the scope of claims for patent. The air ducts 642 and 643 are examples of the "second air duct" in the scope of claims for patent.

Similarly to the first embodiment, the arrangement structure of the air duct 641 and the fin portions 631a provided on both sides thereof in the radiation fin 631 and that of the fin portions 632a around the center and the air ducts 642 and 643 provided on both sides thereof in the radiation fin 632 are in an alternate relation along a Z-axis direction (vertical direction of the railway vehicle 610) as a whole. In other words, the positions of the air ducts 642 and 643 of the radiation fin 632 are different from the position of the air duct 641 of the radiation fin 631 in the vertical direction (Z-axis direction) of the railway vehicle 610.

Thus, when the railway vehicle 610 travels along arrow X1, part of air taken from an end portion 631d of the radiation fin 631 at the forefront in the traveling direction and circulated (bypassed) through the air duct 641 to be discharged is supplied to an end portion 632c of the radiation fin 632 in the traveling direction according to the sixth embodiment. At the same time, air circulated through fin portions 631a provided on both sides other than the air duct 641 to be discharged is circulated through the air ducts 642 and 643 of the radiation fin 632 respectively and discharged along arrow X2. When the railway vehicle 610 travels along arrow X2, on the other hand, part of air taken from an end portion 632d of the radiation fin 632 at the forefront in the traveling direction circulated (bypassed) through the air ducts 642 and 643 to be discharged is supplied to an end portion 631c of the radiation fin 631 in the traveling direction. At the same time, air circulated through fin portions 632a at a central region other than the air ducts 642 and 643 to be discharged is circulated through the air duct 641 of the radiation fin 631 and discharged along arrow X1. The end portions 631c and 632c are examples of the "end portion in the traveling direction" in the scope of claims for patent.

The power conversion device 600 according to the sixth embodiment is obtained by providing the cooling portion 630 on the side portion of the semiconductor device 620 in a structure similar to that of the power conversion device 100 according to the aforementioned first embodiment obtained by providing the cooling portion 30 under the semiconductor device 20. Therefore, the remaining structure of the power conversion device 600 according to the sixth embodiment is similar to that of the power conversion device 100 according to the aforementioned first embodiment, except that the Y- and Z-axis directions of the power conversion device 100 according to the first embodiment are changed to Z- and Y-axis directions respectively.

(Effects of Sixth Embodiment)

According to the sixth embodiment, the following effects can be attained:

According to the sixth embodiment, as hereinabove described, the radiation fin 631 is provided with the air duct 641, while the radiation fin 632 is provided with the air ducts 642 and 643 on the positions different from that of the air duct 641 in the direction (Z-axis direction) orthogonal to the traveling direction. Further, the radiation fin 632 is provided with the plurality of fin portions 632a on positions opposed to the air duct 641 in the traveling direction, while the radiation fin 631 is provided with the plurality of fin portions 631a on positions opposed to the air ducts 642 and 643 in the traveling direction. Thus, when the railway vehicle 610 travels with the radiation fin 631 at the forefront (on the windward side), fresh air circulated (bypassed) through the air duct 641 can be reliably supplied to the plurality of fin portions 632a (heat-exchange regions) of the radiation fin 632 at the rear stage (on the downstream side). When the railway vehicle 610 travels with the radiation fin 632 at the forefront, on the other hand, fresh air circulated (bypassed) through the air ducts 642 and 643 can be reliably supplied to the plurality of fin portions 631a (heat-exchange regions) of the radiation fin 631 at the rear stage. Therefore, the cooling performances (radiation performances) of the respective ones of the radiation fins 631 and 632 can be both leveled regardless of the traveling direction (running direction) of the railway vehicle 610.

According to the sixth embodiment, the radiation fin 631 is provided with the air duct 641, while the radiation fin 632 is provided with the air ducts 642 and 643 on the positions different from that of the air duct 641 in the direction (Z-axis direction) orthogonal to the traveling direction. Further, the radiation fin 632 is provided with the plurality of fin portions 632a on the positions opposed to the air duct 641 in the traveling direction, while the radiation fin 631 is provided with the plurality of fin portions 631a on the positions opposed to the air ducts 642 and 643 in the traveling direction. Thus, when the railway vehicle 610 travels with the radiation fin 631 at the forefront (on the windward side), fresh air circulated (bypassed) through the air duct 641 can be reliably supplied to the plurality of fin portions 632a (heat-exchange regions) of the radiation fin 632 at the rear stage (on the downstream side). When the railway vehicle 61 travels with the radiation fin 632 at the forefront, on the other hand, fresh air circulated (bypassed) through the air ducts 642 and 643 can be reliably supplied to the plurality of fin portions 631a (heat-exchange regions) of the radiation fin 631 at the rear stage. Therefore, the cooling performances (radiation performances) of the respective ones of the radiation fins 631 and 632 can be both leveled regardless of the traveling direction (running direction) of the railway vehicle 610.

According to the sixth embodiment, the air ducts 642 and 643 are provided on the positions of the radiation fin 632 different from that of the air duct 641 in the vertical direction (Z-axis direction) of the railway vehicle 610. Thus, when the fin portions 631a and 632a provided on the radiation fins 631 and 632 respectively extend toward the side portion (Y-axis direction) of the railway vehicle 610, the cooling performances (radiation performances) of the respective ones of the radiation fins 631 and 632 can be both leveled regardless of the traveling direction (running direction) of the railway vehicle 610.

According to the sixth embodiment, the radiation fins 631 and 632 are set in the underfloor space 11a of the railway vehicle 610, while the fin portions 631a and 632a provided on the radiation fins 631 and 632 are extended toward the side portion (along arrow Y2) of the railway vehicle 610. Thus, the radiation fins 631 and 632, whose cooling performances (radiation performances) for cooling the semiconductor device 620 can be easily effectively leveled, can be easily set when a sufficient space for setting the radiation fins 631 and 632 is present on the side portion (along arrow Y2) of the semiconductor device 620 in the railway vehicle 610 having the underfloor space 11a for setting the power conversion device 600 (the semiconductor device 620). According to the sixth embodiment, further, the radiation fins 631 and 632 are so provided on the side portion (along arrow Y2) of the semiconductor device 620 that the same are exposed on the side portion (along arrow Y2) of the semiconductor device 620 at the time of traveling of the railway vehicle 610. Thus, relatively unturbulent traveling wind can be taken as compared with a case of taking fresh air from under the railway vehicle 610 mounted with other devices or the like, whereby fresh air from the side portion (along arrow Y2) of the railway vehicle 610 can be easily taken through the radiation fins 631 and 632. Consequently, the cooling performance (radiation performance) of the cooling portion 630 can be further improved. The remaining effects of the sixth embodiment are similar to those of the aforementioned first embodiment.

[Seventh Embodiment]

Figure 14:
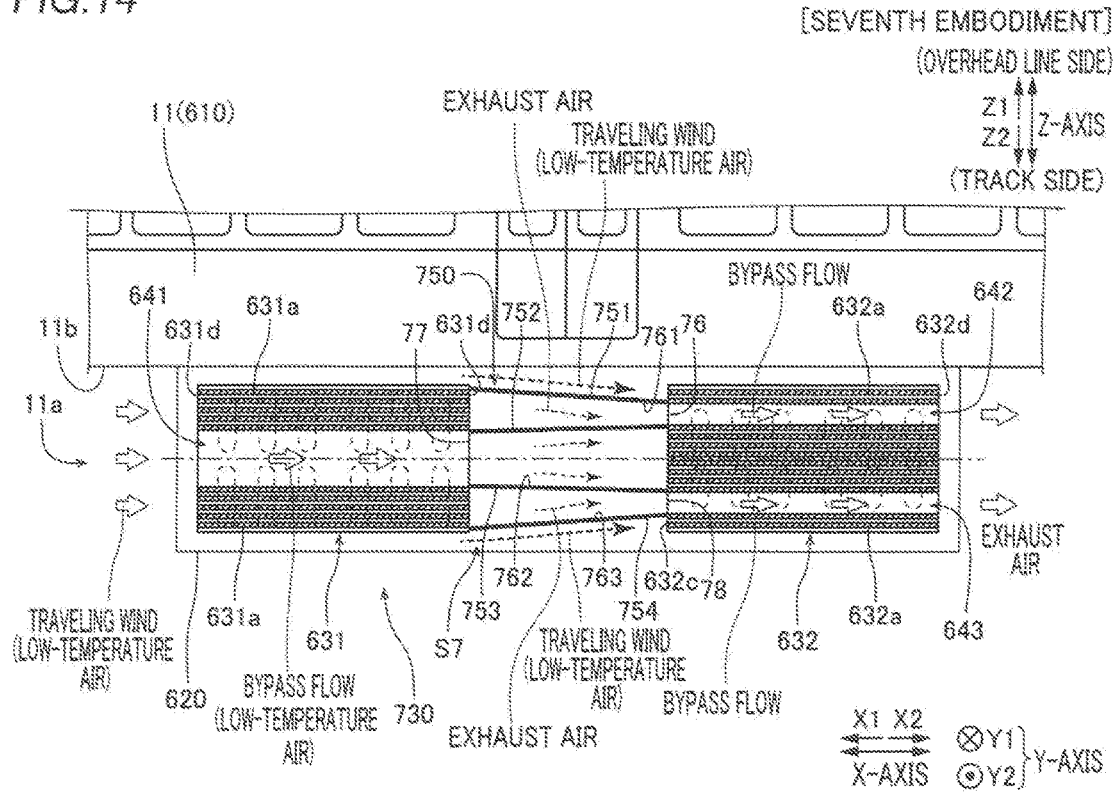
FIG. 14 is a side elevational view showing a cooling structure of a power conversion device according to a seventh embodiment of the present invention.

A power conversion device 700 according to a seventh embodiment of the present invention is now described with reference to FIGS. 11 and 14. According to the seventh embodiment, a wind guide member 750 is further provided in a space S7 between radiation fins 631 and 632. FIG. 14 shows portions similar in structure to those of the aforementioned sixth embodiment with the same reference signs.

The power conversion device 700 (see FIG. 11) according to the seventh embodiment of the present invention includes a cooling portion 730, as shown in FIG. 14. The wind guide member 750 is set for the pair of radiation fins 631 and 632 of the cooling portion 730. In other words, the wind guide member 750 is provided in the space S7 between the radiation fins 631 and 632, as shown in FIG. 14. The wind guide member 750 has four wind guide walls 751 to 754.

When observed along arrow X2, the wind guide wall 751 connects end portions 631c (along arrow X1) of fin portions 631a with an inlet 76 (along arrow X2) of an air duct 642 provided on a position opposed to the fin portions 631a in a traveling direction along arrow Z1, as shown in FIG. 14. The wind guide wall 752 connects the end portions 631c of the fin portions 631a with the inlet 76 of the air duct 742 along arrow Z2. The wind guide wall 752 also connects an outlet 77 (along arrow X1) of the air duct 641 with end portions 632c (along arrow X2) of fin portions 632a provided on positions opposed to the air duct 741 in the traveling direction. The wind guide wall 753 connects the outlet 77 of the air duct 641 with end portions 632c of fin portions 632a provided on positions opposed to the air duct 741 in the traveling direction along arrow Y2. The wind guide wall 753 also connects the end portions 631c (along arrow X1) of the fin portions 631a with an inlet 78 (along arrow X2) of another air duct 643 provided on a position opposed to the fin portions 631a in the traveling direction. The wind guide wall 754 connects the end portions 631c of the fin portions 631a with the inlet 78 of the air duct 643 along arrow Y1. The wind guide walls 751 and 752 constitute an air duct 761, the wind guide walls 752 and 753 constitute another air duct 762 adjacent to the air duct 761 along arrow Y2, and the wind guide walls 753 and 754 constitute still another air duct 763 adjacent to the air duct 762 along arrow Y2.

Thus, when a railway vehicle 610 travels with the radiation fin 631 at the forefront in the traveling direction as shown in FIG. 14, the air duct 762 guides part of air taken from the end portion 631d of the radiation fin 631 and circulated through the air duct 641 to be discharged to the plurality of fin portions 632a on the end portion 632c of the radiation fin 632 as the function of the wind guide member 750. In addition thereto, the air ducts 761 and 763 discharge air taken through the end portion 631d of the radiation fin 631 from the end portions 631c and guide the same to the air ducts 642 and 643 of the radiation fin 632 respectively.

The power conversion device 700 according to the seventh embodiment is obtained by providing the cooling portion 730 on a side portion of a semiconductor device 620 in a structure similar to that of the power conversion device 200 according to the aforementioned second embodiment having the cooling portion 230 provided under the semiconductor device 20. Therefore, the remaining structure of the power conversion device 700 according to the seventh embodiment is similar to that of the power conversion device 200 according to the aforementioned second embodiment, except that the Y- and Z-axis directions of the power conversion device 200 according to the second embodiment are changed to Z- and Y-axis directions respectively.

(Effects of Seventh Embodiment)

According to the seventh embodiment, as hereinabove described, the air duct 762 provided in the space S7 for guiding part of air taken from the end portion 631d of the radiation fin 631 and circulated through the air duct 641 to be discharged to the fin portions 632a on the end portion 632c of the radiation fin 632 and the air ducts 761 and 763 guiding air taken from the end portion 631d of the radiation fin 631 to the air ducts 642 and 643 of the radiation fin 632 respectively constitute the wind guide member 750. Thus, when the railway vehicle 610 travels with the radiation fin 631 at the forefront (on the windward side), fresh air circulated (bypassed) through the air duct 641 can be reliably supplied to 16 fin portions 632a of the radiation fin 632 at the rear stage (on the downstream side). Also when the railway vehicle 610 travels with the radiation fin 632 at the forefront (on the windward side), fresh air circulated through the air ducts 642 and 643 can be reliably supplied to the plurality of fin portions 631a of the radiation fin 631 at the rear stage (on the downstream side). Further, the flow of fresh air (low-temperature air) circulated through the air duct 641 (or the air ducts 642 and 643) and supplied to the radiation fin 632 (or the radiation fin 631) and the flow of air (high-temperature air) heat-exchanged and warmed in the radiation fin 631 (or the radiation fin 632) can be separated from each other by the wind guide member 750 (the wind guide walls 752 and 753). Thus, the roles of the air ducts 642 and 643 (or the air duct 641) and those of the fin portions 632a (or the fin portions 631a) (heat-exchange regions) can be clearly distinguished from each other to effectively function respectively in the radiation fin 632 (or the radiation fin 631) at the rear stage (on the downstream side). According to the seventh embodiment, the radiation fins 631 and 632 are so provided on the side portion (along arrow Y2) of the semiconductor device 620 that the same are exposed on the side portion (along arrow Y2) of the semiconductor device 620 at the time of traveling of the railway vehicle 610. Thus, relatively unturbulent traveling wind can be taken as compared with a case of taking fresh air from under the railway vehicle 610 mounted with other devices or the like, whereby fresh air from the side portion (along arrow Y2) of the railway vehicle 610 can be easily taken through the radiation fins 631 and 632. Consequently, the cooling performance (radiation performance) of the cooling portion 630 can be further improved. The remaining effects of the seventh embodiment are similar to those of the aforementioned second and sixth embodiments.

[Eighth Embodiment]

Figure 15:
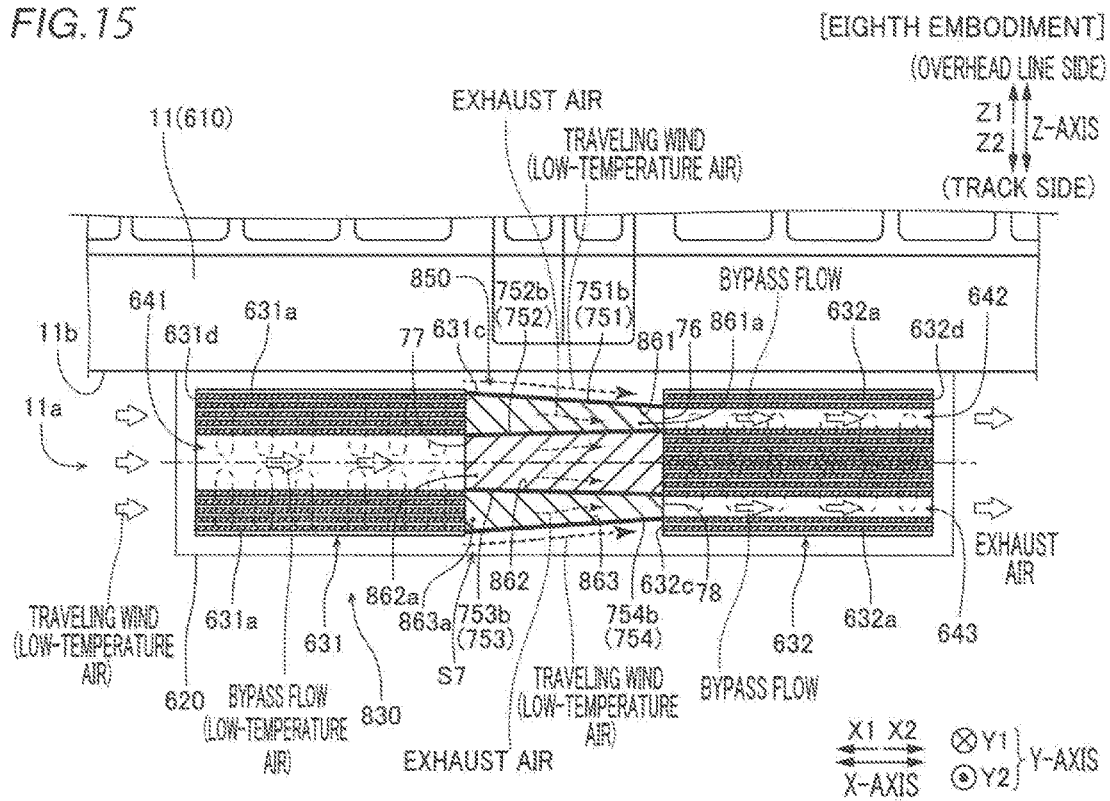
FIG. 15 is a side elevational view showing a cooling structure of a power conversion device according to an eighth embodiment of the present invention.
Figure 16:
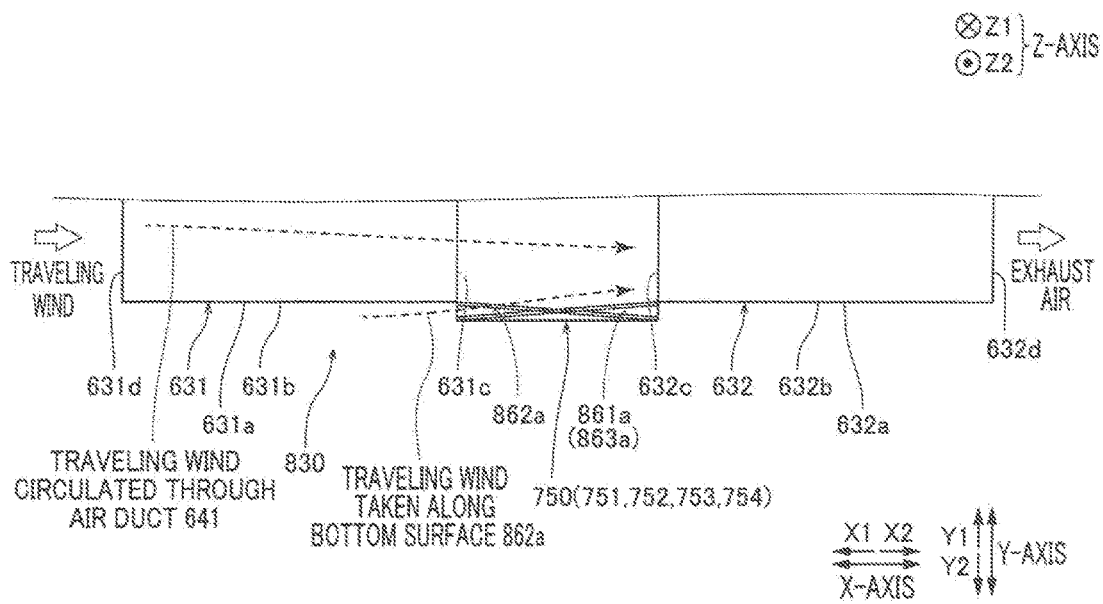
FIG. 16 is a bottom plan view showing a principal part of a cooling portion in the cooling structure of the power conversion device according to the eighth embodiment of the present invention.

A power conversion device 800 according to an eighth embodiment of the present invention is now described with reference to FIGS. 11, 15 and 16. According to the eighth embodiment, a wind guide member 850 is configured to have bottom surfaces 861a to 863a. FIGS. 15 and 16 show portions similar in structure to those of the aforementioned seventh embodiment with the same reference signs.

The power conversion device 800 (see FIG. 11) according to the eighth embodiment of the present invention includes a cooling portion 830, as shown in FIGS. 11 and 15. The wind guide member 850 is set for a pair of radiation fins 631 and 632 of the cooling portion 830.

According to the eighth embodiment, the wind guide member 850 has the bottom surfaces 861a to 863a (shown in a hatched manner for the sake of convenience), as shown in FIG. 15. More specifically, an air duct 861 has the bottom surface 861a connecting forward end portions 751b and 752b of a pair of wind guide walls 751 and 752 in a Y-axis direction with each other. Another air duct 862 has the bottom surface 862a connecting forward end portions 752b and 753b of another pair of wind guide walls 752 and 753 in the Y-axis direction with each other. Still another air duct 863 has the bottom surface 863a connecting forward end portions 753b and 754b of still another pair of sidewalls 753 and 754 in the Y-axis direction with each other.

As shown in FIG. 16, the bottom surface 862a (shown by broken lines) is inclined (along arrow Y1) to approach toward a position corresponding to end portions 632c of fin portions 632a provided on positions opposed to the air duct 641 (see FIG. 15) in the traveling direction from a position sideward (outward along arrow Y2) beyond an outlet 77 of the air duct 641 in a space S7. The bottom surface 861a (shown by broken lines) is inclined (along arrow Y1) to approach toward a position corresponding to end portions 631c of fin portions 631a provided on positions opposed to the air duct 642 (see FIG. 15) in the traveling direction from a position sideward (along arrow Y2) beyond an outlet 76 of the air duct 642 (see FIG. 15) in the space S7. Further, the bottom surface 863a (shown by broken lines) is inclined (along arrow Y1) to approach toward a position corresponding to end portions 631c of fin portions 631a provided on positions opposed to the air duct 643 (see FIG. 15) in the traveling direction from a position sideward (along arrow Y2) beyond an outlet 78 of the air duct 643 (see FIG. 15) in the space S7. In the wind guide member 850, therefore, the bottom surfaces 861a to 863a form lower surfaces of the air ducts 861 to 863 in a state where the directions of inclinations are alternated.

Thus, when the railway vehicle 610 travels with the radiation fin 631 at the forefront, not only fresh air circulated through the air duct 641 but also traveling wind flowing sideward (along arrow Y2) beyond the outlet 77 of the air duct 641 of the radiation fin 631 can be collected through the air duct 862 (see FIG. 15) and supplied to the radiation fin 632 (the fin portions 632a) at the rear stage. When the railway vehicle 610 travels along arrow X2 with the radiation fin 632 at the forefront, on the other hand, not only fresh air circulated through the air ducts 642 and 643 but also traveling wind flowing sideward (along arrow Y2) beyond the outlet 77 of the air duct 641 of the radiation fin 632 can be collected through the air ducts 861 and 863 (see FIG. 16) and supplied to the radiation fin 631 (the fin portions 631a) at the rear stage, although FIG. 15 does not show the flow of wind in this case.

The power conversion device 800 according to the eighth embodiment is obtained by providing the cooling portion 830 on a side portion of the semiconductor device 620 in a structure similar to that of the power conversion device 300 according to the aforementioned third embodiment having the cooling portion 330 provided under the semiconductor device 20. The remaining structure of the power conversion device 800 according to the eighth embodiment is similar to that of the power conversion device 300 according to the aforementioned third embodiment, except that the Y- and Z-axis directions of the power conversion device 300 according to the third embodiment are changed to Z- and Y-axis directions respectively.

(Effects of Eighth Embodiment)

According to the eighth embodiment, as hereinabove described, the air duct 862 of the wind guide member 850 is provided with the bottom surface 862a inclined to approach toward the position corresponding to the end portions 632c of the fin portions 632a provided on the positions opposed to the air duct 641 in the traveling direction from the position outward (sideward) beyond the outlet 77 of the air duct 641 in the direction (Y-axis direction) orthogonal to the traveling direction in the space S7. Thus, when the railway vehicle 610 travels with the radiation fin 631 at the forefront, not only fresh air circulated through the air duct 641 but also traveling wind flowing outward (sideward) beyond the outlet 77 of the air duct 641 of the radiation fin 631 in the direction (Y-axis direction) orthogonal to the traveling direction can be supplied to the rear-stage radiation fin 632 in the state collected through the air duct 862 of the wind guide member 850. Thus, a larger quantity of fresh air can be supplied to the end portions 632c of the fin portions 732a (heat-exchange regions) of the rear-stage radiation fin 632. Also when the railway vehicle 610 travels with the radiation fin 632 at the forefront, effects similar to the above can be attained, with the exception that the direction of the traveling wind is reversed. Further, the radiation fins 631 and 632 are provided on the side portion (along arrow Y2) of the semiconductor device 620 as in the seventh embodiment, so that the same are exposed on the side portion (along arrow Y2) of the railway vehicle 610. Thus, relatively unturbulent traveling wind can be taken as compared with a case of taking fresh air from under the railway vehicle 610 mounted with other devices or the like, whereby fresh air from the side portion (along arrow Y2) of the railway vehicle 610 can be easily taken through the radiation fins 631 and 632. Consequently, the cooling performance (radiation performance) of the cooling portion 830 can be further improved. The remaining effects of the eighth embodiment are similar to those of the aforementioned third and seventh embodiments.

[Modifications]

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the power conversion device 100, 200, 300, 400, 500, 600, 700 or 800 set in the underfloor space 11a of the vehicle body 11 in each of the aforementioned first to eighth embodiments, the present invention is not restricted to this. The present invention may alternatively be applied to cooling of a "body of a power conversion device" set on the roof of a vehicle body 11, for example.

While the radiation fin 31 (431) is provided with the air duct 41 and the radiation fin 32 (432) is provided with the air ducts 42 and 43 in each of the aforementioned first to fifth embodiments, the present invention is not restricted to this. For example, only the radiation fin 31 may be provided with the air duct 41, and the radiation fin 32 may be provided with no air ducts.

While the radiation fin 631 is provided with the air duct 641 and the radiation fin 632 is provided with the air ducts 642 and 643 in each of the aforementioned sixth to eighth embodiments, the present invention is not restricted to this. For example, only the radiation fin 631 may be provided with the air duct 641, and the radiation fin 632 may be provided with no air ducts.

While the radiation fin 31 (431) is provided with the single air duct 41 and the radiation fin 32 (432) is provided with the air ducts 42 and 43 in each of the aforementioned first to fifth embodiments, the present invention is not restricted to this. When the radiation fins 31 and 32 are longer in the crosstie direction (Y-axis direction), for example, the radiation fin 31 may be provided with two "first air ducts" parallel to each other at a prescribed interval and the radiation fin 32 may be provided with fin portions 32a on a position where the two "first air ducts" are opposed to each other, while three "second air ducts" may be provided on positions deviating from the fin portions 32a in the crosstie direction (Y-axis direction).

While the radiation fin 631 is provided with the single air duct 641 and the radiation fin 632 is provided with the air ducts 642 and 643 in each of the aforementioned sixth to eighth embodiments, the present invention is not restricted to this. When the radiation fins 631 and 632 are longer in the vertical direction (Z-axis direction) of the railway vehicle 10, for example, the radiation fin 631 may be provided with two "first air ducts" parallel to each other at a prescribed interval and the radiation fin 632 may be provided with fin portions 632a on a position where the two "first air ducts" are opposed to each other, while three "second air ducts" may be provided on positions deviating from the fin portions 632a in the vertical direction (Z-axis direction) of the railway vehicle 10.

While the radiation fins 31 and 32 are configured to have the 26 fin portions 31a and 32a in total in each of the aforementioned first to third embodiments and the radiation fins 431 and 432 are configured to have the 36 fin portions 431a and 432a in total in each of the aforementioned fourth and fifth embodiments, the present invention is not restricted to this. The total number of the fin portions provided on the first and second radiation fins may be other than the above, in response to the cooling ability of the cooling portion 30, 230, 330 430 or 530.

While the wind guide member 50 is provided with no bottom surface in the aforementioned fifth embodiment, the present invention is not restricted to this. In other words, the cooling portion 530 may alternatively be configured to have the wind guide member 350 shown in the aforementioned third embodiment, in place of the wind guide member 50.

While the radiation fins 631 and 632 are provided on the single side surface (along arrow Y2) of the semiconductor device 620 in each of the aforementioned sixth to eighth embodiments, the present invention is not restricted to this. The radiation fins 631 and 632 may alternatively be provided on the other side surface (along arrow Y1) of the semiconductor device 620. Further alternatively, the radiation fins 631 and 632 may be provided on both side surfaces of the semiconductor device 620.

While the radiation fins 31 (431, 631) and 32 (432, 632) are provided on either the side surface or the lower surface of the semiconductor device 20 (620) in each of the aforementioned first to eighth embodiments, the present invention is not restricted to this. A plurality of radiation fins may alternatively be provided on both of the side surface and the lower surface of the body of the power conversion device.

While the present invention is applied to the power conversion device 100, 200, 300, 400, 500, 600, 700 or 800 of the overhead line-system railway vehicle 10 (610) traveling through power received from the overhead line 2 in each of the aforementioned first to eighth embodiments, the present invention is not restricted to this. The present invention may alternatively be applied to cooling of a power conversion device for a third rail-system railway vehicle 10 (610) having a vehicle body 11 provided with a collector shoe collecting power by rubbing against a third feeder rail (third rail) laid in parallel with a rail for traveling.

While the present invention is applied to the power conversion device 100, 200, 300, 400, 500, 600, 700 or 800 of the overhead line-system railway vehicle 10 (610) traveling through power received from the overhead line 2 in each of the aforementioned first to eighth embodiments, the present invention is not restricted to this. The present invention may alternatively be applied to cooling of an apparatus loaded on a railcar having a diesel engine as a direct driving source or cooling of a power conversion device for a railway vehicle 10 (610) such as an electric railcar rotating induction motors 14 through power generation of a diesel engine.

What is claimed is:

1. A power conversion device for a railway vehicle defining a travel axis which includes first and second travel directions opposed to each other, comprising:
    a first radiation fin unit having a plurality of fin portions provided to extend along said travel axis of the railway vehicle for radiating heat from a body of the power conversion device loaded on the railway vehicle; and
    a second radiation fin unit, arranged at a prescribed interval from the first radiation fin unit along the travel axis, having a plurality of fin portions provided to extend along the travel axis for radiating heat from the body of the power conversion device,
    wherein the first radiation fin unit and the second radiation fin unit include a first air duct and second air ducts respectively, extending along the travel axis, formed by partially not providing the plurality of fin portions, for supplying a part of air taken from an end portion of either the first radiation fin unit or the second radiation fin unit depending upon the traveling direction of the vehicle, and circulated through the first air duct or the second air ducts to be discharged to the end portion of either the second radiation fin unit or the first radiation fin unit depending upon the traveling direction of the vehicle, and
    outer end faces of the first radiation fin unit and the second radiation fin unit in a direction orthogonal to the travel axis are exposed in a side direction of the first radiation fin unit and the second radiation fin unit which is the direction orthogonal to the travel axis.

2. The power conversion device for a railway vehicle according to claim 1, wherein the second air ducts are provided on positions of the second radiation fin unit different from the first air duct in the direction orthogonal to the travel axis,
    the second radiation fin unit is provided with the plurality of fin portions on a position opposed to the first air duct in a direction a direction along the travel axis, and
    the first radiation fin unit is provided with the plurality of fin portions on positions opposed to the second air ducts in the direction along the travel axis.

3. The power conversion device for a railway vehicle according to claim 2, wherein the first air duct is provided on a central region of the first radiation fin unit in the direction orthogonal to the travel axis, and
    air circulated through the first air duct to be discharged is supplied to end portions of the plurality of fin portions provided on a position corresponding to a central region of the second radiation fin unit in the direction orthogonal to the travel axis while air circulated through the plurality of fin portions other than the first air duct to be discharged is circulated through the second air ducts of the second radiation fin unit and discharged when the railway vehicle travels in the first travel direction wherein the first radiation fin unit is located at a forefront.

4. The power conversion device for a railway vehicle according to claim 2, wherein a range of formation of the plurality of fin portions of the second radiation fin unit provided on the position opposed to the first air duct in the direction orthogonal to the travel axis is broader than a width of the first air duct in the direction orthogonal to the travel axis, and a range of formation of the plurality of fin portions of the first radiation fin unit provided on the positions opposed to the second air ducts in the direction orthogonal to the travel axis is broader than the width of the first air duct in the direction orthogonal to the travel axis.

5. The power conversion device for a railway vehicle according to claim 2, wherein a width of the first air duct along the direction orthogonal to the travel axis is smaller than a range of formation of the plurality of fin portions other than the first air duct in the first radiation fin unit.

6. The power conversion device for a railway vehicle according to claim 2, wherein the second air ducts are provided on sides of the outer end faces of the second radiation fin unit in the direction orthogonal to the travel axis.

7. The power conversion device for a railway vehicle according to claim 6, wherein the second air ducts include two air ducts which are provided on regions close to both the outer end faces of the second radiation fin unit in the direction orthogonal to the travel axis.

8. The power conversion device for a railway vehicle according to claim 6, wherein air taken from a side end portion of the second radiation fin unit in the direction along the travel axis is supplied to the plurality of fin portions provided on side portions beyond the second air ducts when the railway vehicle travels in the first travel direction wherein the first radiation fin unit is located at a forefront.

9. The power conversion device for a railway vehicle according to claim 1, further comprising a heat pipe provided within a connection region of at least either one of the first radiation fin unit and the second radiation fin unit, including the first air duct and the second air ducts, with the body of the power conversion device to extend in the direction orthogonal to the travel axis over a region of formation of the plurality of fin portions and a region of formation of the first air duct or the second air ducts.

10. The power conversion device for a railway vehicle according to claim 1, further comprising a wind guide member provided on a region between the first radiation fin unit and the second radiation fin unit for guiding a part of air taken from the end portion of either the first radiation fin unit or the second radiation fin unit depending upon the traveling direction of the vehicle and circulated through the first air duct or the second air ducts to be discharged to the plurality of fin portions on the end portion of either the second radiation fin unit or the first radiation fin unit depending upon the traveling direction of the vehicle.

11. The power conversion device for a railway vehicle according to claim 10, wherein the wind guide member connects an outlet of the first air duct or each of the second air ducts with end portions of the plurality of fin portions provided on a position opposed to the first air duct or each of the second air ducts in the direction along the travel axis on the region between the first radiation fin unit and the second radiation fin unit.

12. The power conversion device for a railway vehicle according to claim 10, wherein the wind guide member includes a wind guide wall extending outward beyond forward end portions of the plurality of fin portions of each of the first radiation fin unit and the second radiation fin unit in the direction orthogonal to the travel axis.

13. The power conversion device for a railway vehicle according to claim 12, wherein the wind guide member further includes a bottom surface connecting outer end portions of a pair of the wind guide walls, and the bottom surface is inclined to approach toward a position corresponding to end portions of the plurality of fin portions provided on the position opposed to the first air duct or each of the second air ducts in the direction along the travel axis from a position outward beyond an outlet of the first air duct or each of the second air ducts in the direction orthogonal to the travel axis on the region.

14. The power conversion device for a railway vehicle according to claim 4, further comprising a wind guide member provided on a region between the first radiation fin unit and the second radiation fin unit for guiding a part of air taken from the end portion of either the first radiation fin unit or the second radiation fin unit depending upon the traveling direction of the vehicle and circulated through the first air duct or the second air ducts to be discharged to the plurality of fin portions on the end portion of either the second radiation fin unit or the first radiation fin unit in the traveling direction depending upon the traveling direction of the vehicle, wherein a width of the wind guide member in the direction orthogonal to the travel axis is gradually increased from an outlet of the first air duct or each of the second air ducts toward end portions of the plurality of fin portions.

15. The power conversion device for a railway vehicle according to claim 1, wherein an arrangement structure of the plurality of fin portions and the first air duct in the first radiation fin unit and an arrangement structure of the plurality of fin portions and the second air ducts in the second radiation fin unit have shapes symmetrical with respect to a centerline along the travel axis in the direction orthogonal to the travel axis.

16. The power conversion device for a railway vehicle according to claim 2, wherein the second air ducts are provided on positions of the second radiation fin unit different from the first air duct in the direction orthogonal to the travel axis.

17. The power conversion device for a railway vehicle according to claim 16, wherein the first radiation fin unit and the second radiation fin unit are set in an underfloor space of the railway vehicle while the plurality of fin portions provided on each of the first radiation fin unit and the second radiation fin unit extends toward a lower portion of the railway vehicle.

18. The power conversion device for a railway vehicle according to claim 2, wherein the second air ducts are provided on positions of the second radiation fin unit different from the first air duct in a vertical direction of the railway vehicle orthogonal to the travel axis.

19. The power conversion device for a railway vehicle according to claim 18, wherein the first radiation fin unit and the second radiation fin unit are set in an underfloor space of the railway vehicle while the plurality of fin portions provided on each of the first radiation fin unit and the second radiation fin unit extends toward a side portion of the railway vehicle.

20. The power conversion device for a railway vehicle according to claim 1, wherein the first radiation fin unit includes the plurality of fin portions having a first fin portion and a second fin portion apart from the first fin portion in the direction orthogonal to the travel axis, and the first air duct between the first fin portion and the second fin portion, the second radiation fin unit includes the plurality of fin portions having a third fin portion, a fourth fin portion, a fifth fin portion, the fourth fin portion and the fifth fin portion being apart from the third fin portion in the direction orthogonal to the travel axis, and the second air ducts having a second air duct portion between the third fin portion and the fourth fin portion and a third air duct portion between the third fin portion and the fifth portion, the first radiation fin unit is arranged apart from the second radiation fin unit in the direction along the travel axis to form a space therebetween through which air is supplied from an outside of the first radiation fin unit or the second radiation fin unit to the fourth fin portion and the fifth fin portion of the second radiation fin unit, or the first fin portion and the second fin portion of the first radiation fin unit, depending upon the traveling direction of the vehicle, and the first air duct is arranged to be opposed to the third fin portion, the second air duct portion is arranged to be opposed to the first fin portion, and the third air duct portion is arranged to be opposed to the second fin portion, through the space in the direction along the travel axis.

* * * * *